United States Patent
Cantell et al.

(10) Patent No.: US 6,900,519 B2
(45) Date of Patent: May 31, 2005

(54) DIFFUSED EXTRINSIC BASE AND METHOD FOR FABRICATION

(75) Inventors: Marc W. Cantell, Sheldon, VT (US); James S. Dunn, Jericho, VT (US); David L. Harame, Essex Junction, VT (US); Robb A. Johnson, Thousand Oaks, CA (US); Louis D. Lanzerotti, Burlington, VT (US); Stephen A. St. Onge, Coichester, VT (US); Brian L. Tessier, Essex Junction, VT (US); Ryan W. Wuthrich, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/865,138

(22) Filed: Jun. 10, 2004

(65) Prior Publication Data

US 2004/0222495 A1 Nov. 11, 2004

Related U.S. Application Data

(62) Division of application No. 10/064,476, filed on Jul. 18, 2002.

(51) Int. Cl.[7] ...................... H01L 27/082; H01L 21/331
(52) U.S. Cl. ...................... 257/587; 257/566; 257/588; 257/592; 438/364; 438/365; 438/366; 438/367; 438/388
(58) Field of Search .................................. 257/362, 383, 257/525, 526, 557, 587, 588, 565–566, 5; 438/364–368

(56) References Cited

U.S. PATENT DOCUMENTS 3,904,450 A 9/1975 Evans et al.
4,252,581 A 2/1981 Anantha et al.
4,495,512 A 1/1985 Isaac et al.

(Continued)

FOREIGN PATENT DOCUMENTS

| EP | 961006640 | 1/1996 |
| WO | PCT/US99/07644 | 4/1999 |

OTHER PUBLICATIONS

IBM Technical Disclosure Bulletin, vol. 26, No. 2, Jul. 1983, "Transistor Collector Doping for Reduced Capacitance", W.P. Dumke, p. 492.

(Continued)

*Primary Examiner*—Donghee Kang
(74) *Attorney, Agent, or Firm*—Schmeiser, Olsen & Watts; Anthony Canale

(57) ABSTRACT

The present invention provides a unique device structure and method that provides increased transistor performance in integrated bipolar circuit devices. The preferred embodiment of the present invention provides improved high speed performance by providing reduced base resistance. The preferred design forms the extrinsic base by diffusing dopants from a dopant source layer and into the extrinsic base region. This diffusion of dopants forms at least a portion of the extrinsic base. In particular, the portion adjacent to the intrinsic base region is formed by diffusion. This solution avoids the problems caused by traditional solutions that implanted the extrinsic base. Specifically, by forming at least a portion of the extrinsic base by diffusion, the problem of damage to base region is minimized. This reduced damage enhances dopant diffusion into the intrinsic base. Additionally, the formed extrinsic base can have improved resistance, resulting in an improved maximum frequency for the bipolar device. Additionally, the extrinsic base can be formed with a self-aligned manufacturing process that reduces fabrication complexity.

17 Claims, 35 Drawing Sheets

U.S. PATENT DOCUMENTS

| | | | |
|---|---|---|---|
| 4,860,085 A | | 8/1989 | Feygenson |
| 5,117,271 A | | 5/1992 | Comfort et al. |
| 5,213,989 A | * | 5/1993 | Fitch et al. ............... 438/365 |
| 5,268,314 A | | 12/1993 | Conner |
| 5,439,833 A | | 8/1995 | Hebert et al. |
| 5,593,905 A | | 1/1997 | Johnson et al. |
| 5,629,556 A | | 5/1997 | Johnson |
| 5,761,080 A | | 6/1998 | DeCamp et al. |
| 6,437,376 B1 | * | 8/2002 | Ozkan ...................... 257/197 |

OTHER PUBLICATIONS

IBM Technical Disclosure Bulletin, vol. 25, No. 4, Sep. 1982, "Using a Doubly Implanted Polysilicon Layer for Forming Base and Emitter Regions", C.G. Jambotkar, ppp. 1887–1889.

IBM Technical Disclosure Bulletin, vol. 24, No. 7A, Dec. 1981, "Polycide Bipolar Transistor Process", F. Barson, et al., pp. 3424–3426.

* cited by examiner

DIFFUSED EXTRINSIC BASE AND METHOD FOR FABRICATION

This application is a divisional of Ser. No. 10/064,476; filed on Jul. 18, 2002.

BACKGROUND OF THE INVENTION

1. Technical Field

The present invention relates generally to the field of semiconductor manufacturing and, more specifically, to a method for forming improved transistors that have improved high frequency response.

2. Background Art

The need to remain cost and performance competitive in the production of semiconductor devices has caused continually increasing device performance requirements in integrated circuits. To facilitate the increase in circuit functionality, new technologies are constantly needed to increase the performance of the semiconductor devices. This improvement in device performance may involve higher frequency performance as well as increased frequency performance at low current densities which enables low power circuit designs. However, a successful technology must provide high performance with increased circuit performance at low wafer cost.

Transistor performance is of particular concern in bipolar transistor design. Bipolar transistors are commonly used for analog devices where operational speed is of paramount concern. There are many different critical features in the design of high performance bipolar transistors. These include the intrinsic and extrinsic base resistance, the vertical profile of the base doping and germanium fraction, the collector doping, collector-base and base-emitter capacitances, and collector and emitter resistances. To achieve higher power performance, it is generally desirable to reduce intrinsic and extrinsic base resistance. Reducing the base resistence increases the maximum operating frequency ($f_{max}$) of the transistor. Unfortunately, most methods to reduce base resistance are hampered by: 1) implantation enhanced diffusion of the intrinsic base dopant caused by the implantation process for the extrinsic base which widens the intrinsic base and thus reduces its frequency performance; 2) high wafer cost caused by a complex transistor process; and 3) difficulty of integrating the NPN device process with the CMOS process steps.

Thus, what is needed is an improved device structure and method that improves transistor performance with minimal cost and process complexity. Without an improved method and structure for forming such devices the performance of these devices will continue to be compromised.

BRIEF SUMMARY OF THE INVENTION

Accordingly, the present invention provides a unique device structure and method that provides increased transistor performance in integrated bipolar circuit devices. The preferred embodiment of the present invention provides improved high speed performance by providing reduced base resistance. The preferred design forms the extrinsic base by diffusing dopants from a dopant source layer into the extrinsic base region. This diffusion of dopants forms at least a portion of the extrinsic base. In particular, the portion adjacent to the intrinsic base region is formed by diffusion. This solution avoids the problems caused by traditional solutions that implanted the extrinsic base. Specifically, by forming at least a portion of the extrinsic base by diffusion, the problem of damage to base region is minimized. Additionally, the formed extrinsic base can have improved resistence, resulting in an improved maximum frequency for the bipolar device. Additionally, the extrinsic base can be formed with a self-aligned manufacturing process that reduces fabrication complexity and thus lower cost.

The foregoing and other advantages and features of the invention will be apparent from the following more particular description of a preferred embodiment of the invention, as illustrated in the accompanying drawings.

BRIEF DESCRIPTION OF THE SEVERAL VIEWS OF THE DRAWINGS

The preferred exemplary embodiment of the present invention will hereinafter be described in conjunction with the appended drawings, where like designations denote like elements.

DETAILED DESCRIPTION OF THE INVENTION

The present invention provides a unique device structure and method that provides increased transistor performance in integrated bipolar circuit devices. The preferred embodiment of the present invention provides improved high speed performance by providing reduced base resistance. The preferred design forms the extrinsic base by diffusing dopants from a dopant source layer and into the extrinsic base region. This diffusion of dopants forms at least a portion of the extrinsic base. In particular, the portion adjacent to the intrinsic base region is formed by diffusion. This solution avoids the problems caused by traditional solutions that implanted the extrinsic base. Specifically, by forming at least a portion of the extrinsic base by diffusion, the problem of damage to base region is minimized. This reduced damage enhances dopant diffusion into the intrinsic base. Additionally, the formed extrinsic base can have improved resistence, resulting in an improved maximum frequency for the bipolar device. Additionally, the extrinsic base can be formed with a self-aligned manufacturing process that reduces fabrication complexity.

In addition, this structure features a "raised" extrinsic base, wherein the extrinsic base is built above the layers comprising the intrinsic base. Using this raised extrinsic base, the majority of the base current is carried through the "raised" extrinsic base, which decreases the transistor's base-collector capacitance as well as the previously mentioned base resistance. Conventional bipolar transistors feature an extrinsic base wherein the extrinsic base is built in the same layers as the intrinsic base using implantation to create the heavily doped extrinsic base. Since the extrinsic base region is typically far deeper than the intrinsic base, this structure is susceptible to high base-collector capacitance due to the deep p-type extrinsic base encroaching on the n-type collector. High base-collector capacitance reduces ($f_{max}$) (in addition to high base resistance). The "raised"

extrinsic base structure features a layer built above the intrinsic base, thus reducing base-collector capacitance and base resistance simultaneously. The extrinsic base to intrinsic base link is made by well controlled outdiffusion of dopants from the extrinsic base rather than by implantation.

Figure 1:
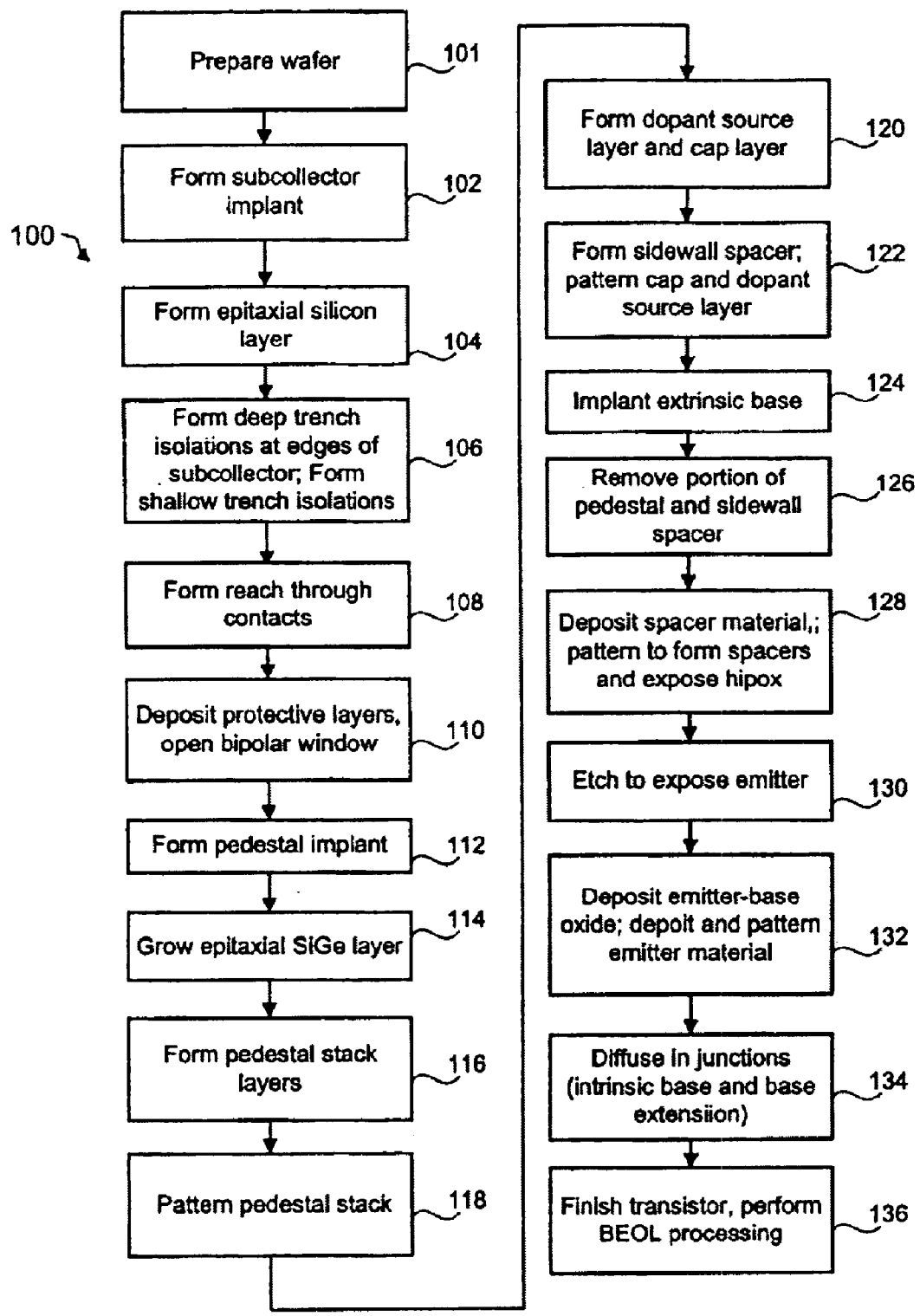
FIG. 1 is a flow diagram illustrating a preferred method in accordance with the present invention.

Turning now to FIG. 1, a method 100 for forming an integrated circuit in accordance is illustrated. In the preferred embodiment, the fabrication process is one that provides the ability to fabricate bipolar transistors. For example, a BiCMOS process that can form bipolar transistors can be used. Such a process can be used to provide both the high performance available from bipolar transistors and the high density logic available from FET devices.

As will be explained in greater detail later, in the most preferred embodiment silicon germanium (SiGe) heterojunction bipolar transistors (HBTs) are formed to provide high speed analog processing. Of course, other bipolar transistor technology can be used, including bipolar junction transistors. Thus, the result is a solution that utilizes SiGe BiCMOS to provide high speed analog and/or digital devices. The preferred process can be used to form devices used in a wide range of applications, including high speed wireless communication.

It should also be noted that while the preferred embodiment method 100 will be described with reference to the fabrication and use with a implanted intrinsic base bipolar NPN transistor or an epi-grown SiGe base bipolar NPN, that the structure can be used with other devices, such as a PNP transistor and other BiCMOS passive and active elements. For example, it can be used in conjunction with a varactor, a p-i-n diode, resistors, and/or an isolated FET. Furthermore, it can be used with various different kinds of transistor designs, such as homojunction bipolar transistors, SiGe heterojunction transistors, and/or SiGeC transistors. In those cases, the method will vary from method 100 in ways appropriate to the device formed.

The first step of method 101 is to prepare the wafer. This suitably involves providing a p type, single crystal silicon wafer, followed by processing to remove surface defects. In the preferred embodiment, the wafer comprises a lightly doped, high resistivity, p– substrate. Such a substrate provides for low noise transmission, improved on-chip inductors, and low collector substrate capacitance, and thus improves the noise tolerance and performance of the resulting bipolar transistors and total chip solution.

The next step 102 is to form a subcollector implant in the wafer. This preferably comprises forming a highly n+ doped implant at the surface of the wafer in areas where bipolar devices are to be formed. In particular, the preferred process is as follows: A subcollector (NZ) mask is placed on the surface of the wafer. The mask is then selectively removed to open a central region for the subcollector implant. A high dose implant is done, preferably a n+ dopant, to form a subcollector region.

Figure 2:
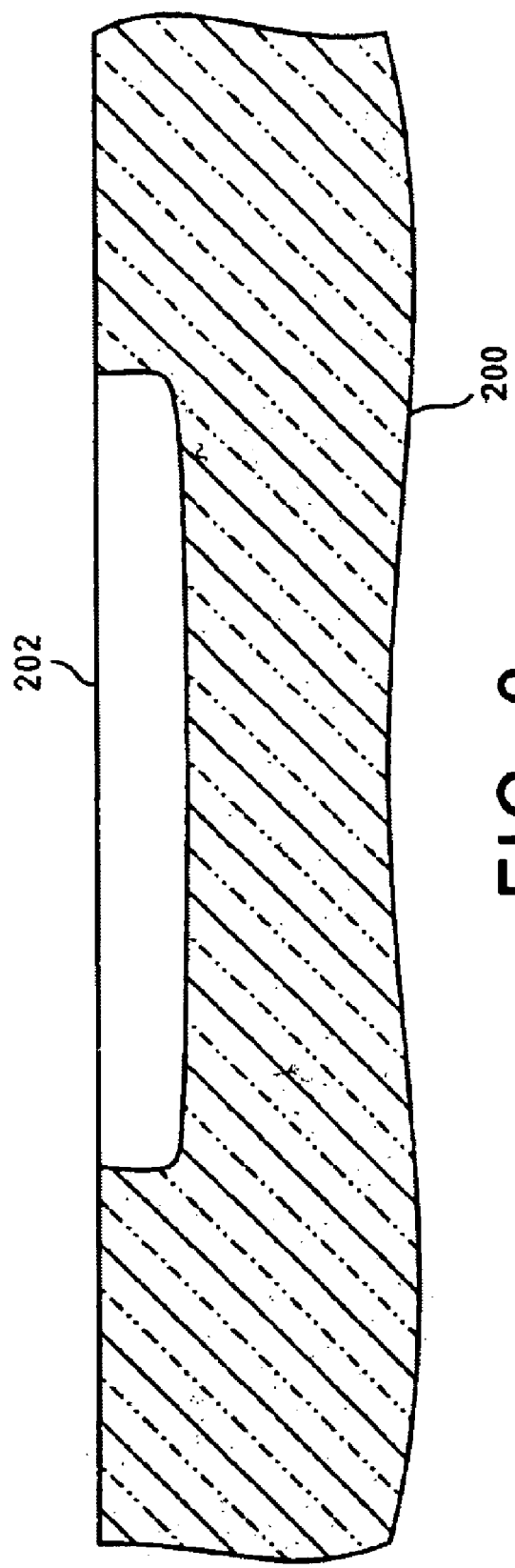
FIGS. 2–23 are schematic cross sections of a wafer substrate illustrating an embodiment of the present invention.

Turning to FIG. 2, a wafer portion 200 is illustrated after the formation of a subcollector implant 202. Again, wafer portion 200 preferably comprises a lightly doped p– wafer, and subcollector implant 202 preferably comprises a highly doped, n+ implant.

Returning to FIG. 1, the next step 104 is to grow an epitaxial layer over the surface of the wafer. Preferably the epitaxial layer as formed comprises a 0.25–2 micron thick lightly doped layer. Because the epitaxial process is a hot process, the subcollector implant diffuses into the epitaxial layer and further diffuses into the substrate.

Figure 3:
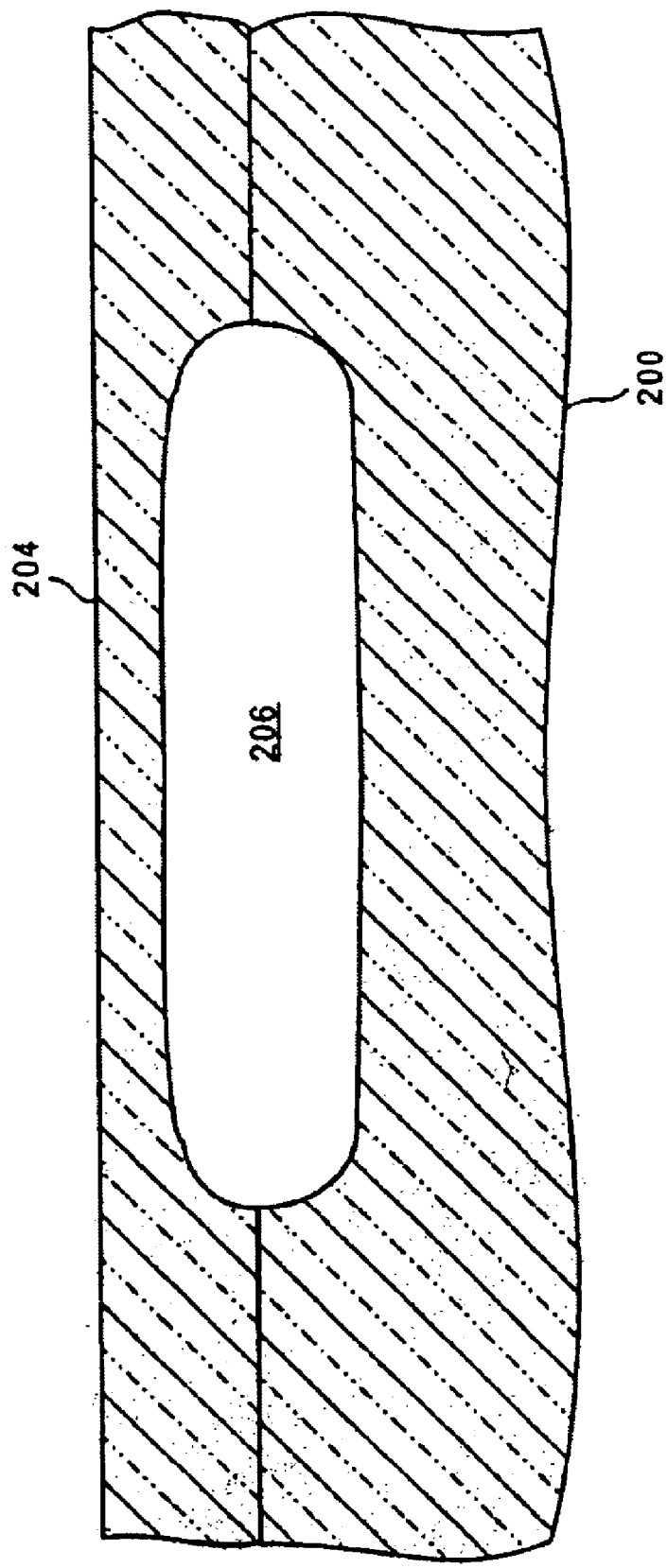

Turning now to FIG. 3, the wafer portion 200 is illustrated after the formation of an epitaxial layer 204. The process of forming the epitaxial layer 204 has likewise caused the subcollector implant 202 to diffuse, forming the subcollector 206. It should be noted that the subcollector could be formed in other ways, such as a high energy implanted subcollectors.

Returning to FIG. 1, the next step 106 is to form a deep trench isolation around the edges of the subcollector. In the preferred embodiment, the deep trench isolations are formed deep enough to extending through the buried layer and subcollector. The preferred process for forming deep isolation trenches is as follows. First, a deep trench (DT) resist is deposited and selectively removed to form a mask for etching deep trenches in the epitaxial layer and wafer substrate. Etching is then done by reactive ion etching (RIE) or other suitable technique to form the deep trenches in the substrate. A channel stop is then implanted across the wafer, forming an implant at the bottom of the trench. An isolation film is then deposited there over to form an oxide dielectric in the trench. The remaining portions of the deep trench are then filled with polysilicon.

Figure 4:
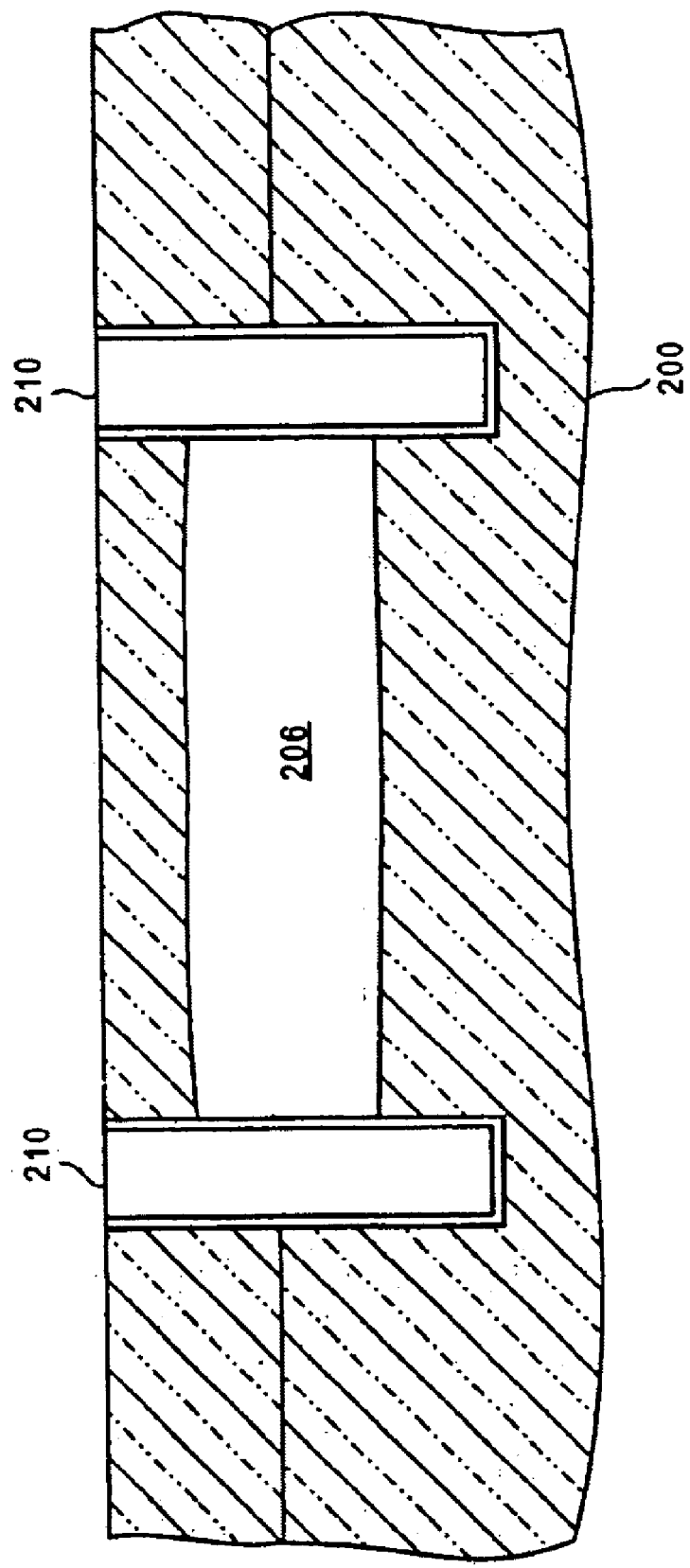

Turning now to FIG. 4, the wafer portion 200 is illustrated after the formation of deep trench isolation 210. The deep trench isolation 210 is formed at the edges of the subcollector 206 and extends through the subcollector 206. The preferred embodiment deep trench isolation 210 is lined with oxide and then filled with polysilicon. Thus formed, the deep trench isolation 210 serves to isolate the subcollector 206.

Returning to FIG. 1, the next part of step 106 is to form shallow trench isolations in non-active area regions of the wafer. Additionally, a shallow trench isolation region is preferably formed to separate the NPN area of the bipolar transistor from the reach through contact area. This is preferably done by etching shallow trenches in selective areas, filling those trenches with suitable dielectrics, and planarizing the top surface of the shallow trench isolations and the wafer.

Figure 5:
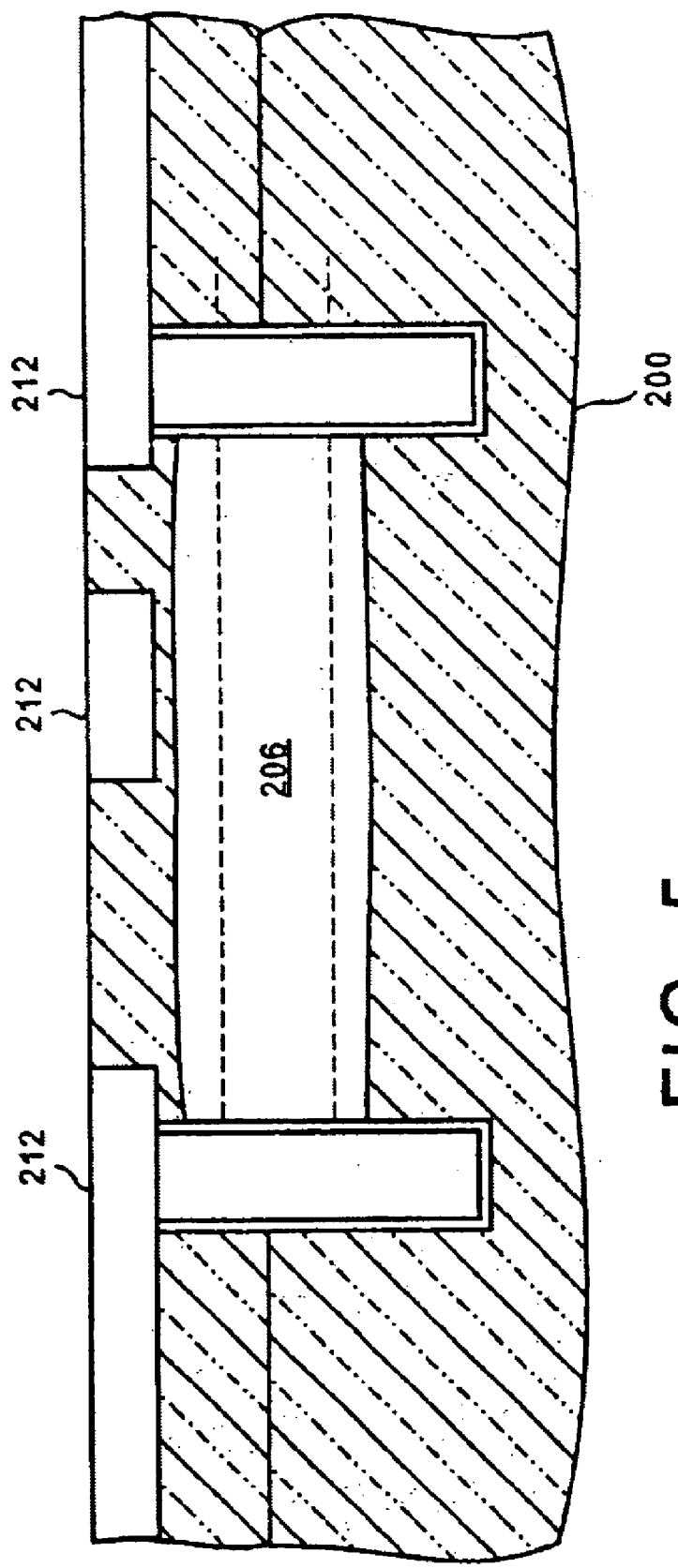

Turning now to FIG. 5, the wafer portion 200 is illustrated after the formation of shallow trench isolation regions 212. Shallow trench isolation regions 212 have been formed in the non-active areas, as well as between the NPN area of the bipolar transistor and the reach through contact area.

Returning to FIG. 1, with the shallow trench isolations formed, the next step 108 is to form reach through contacts to contact to the collector of the bipolar transistor. This is preferably done by selectively depositing a reach through implant resist (RN), leaving openings over the reach through region between the shallow trench isolation regions. A reach through implant is then performed using ion implantation across the wafer. The RN resist is then stripped.

The next step 110 is to form protective layers on the wafer and open a bipolar window in the layers. In particular, an NPN protective nitride is then deposited over the surface of the wafer, and a protect nitride resist (PX) is deposited and selectively removed, except over the NPN area and a portion of the adjacent shallow trench isolation. The protective nitride is then stripped, except where protected by the PX resist.

Next a protective oxide layer is applied followed by a polysilicon protective layer and oxide layers. A resist layer (BX) is then deposited and patterned to open the bipolar window and thus reveal the NPN area of the bipolar transistors.

Figure 6:
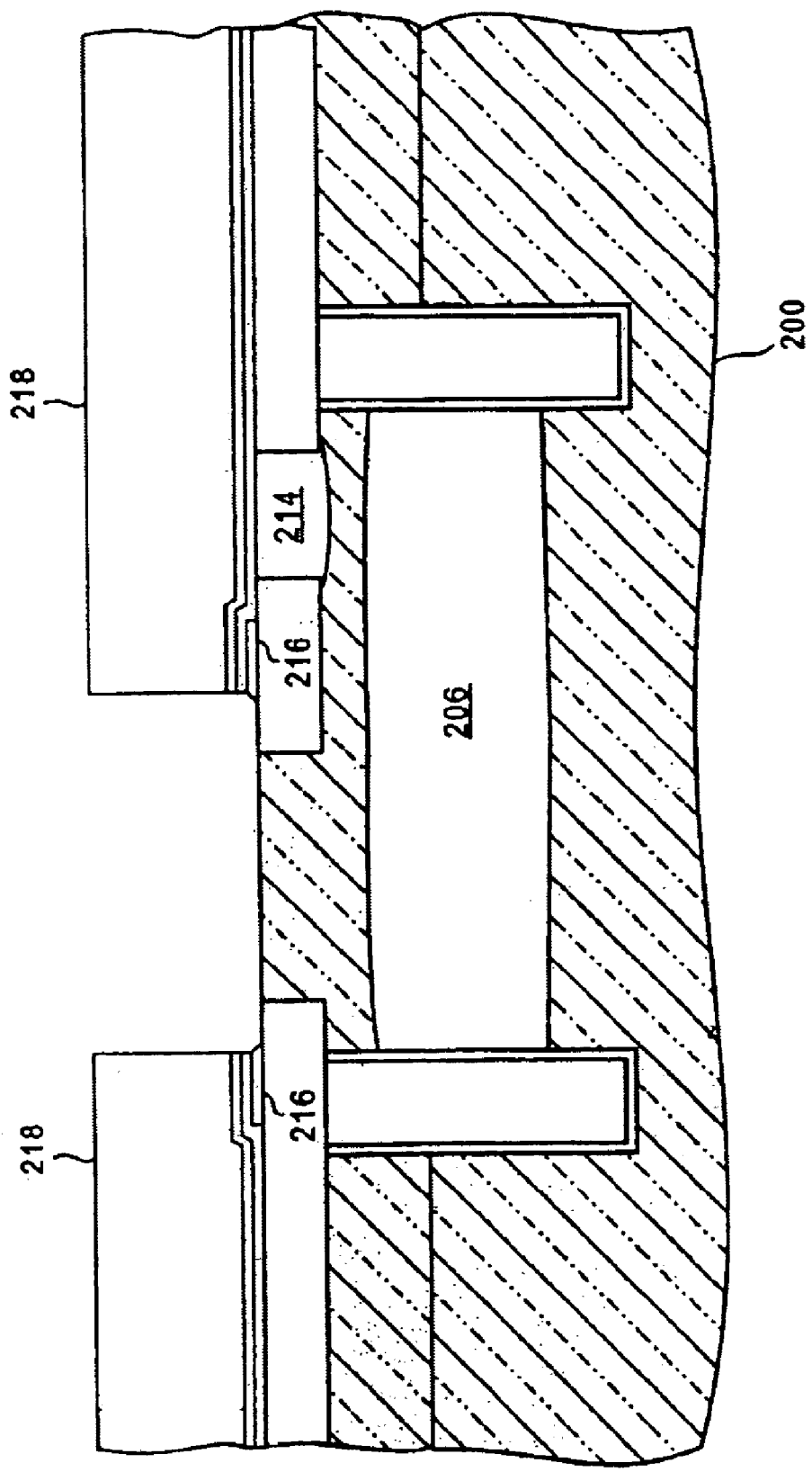

Turning now to FIG. 6, the wafer portion 200 is illustrated after formation of reach through contact implants 214, the depositing and patterning of the NPN protective nitride, the deposition of protective layers, the deposition and patterning of resist layer 218 and the removal of exposed portions of the NPN protective nitride to open the bipolar window and complete nitride pads 216.

It should be note that in BiCMOS applications, various CMOS process steps would distributed throughout the described process. For example, some CMOS processing would occur after the formation of the nitride protective layer.

Returning to FIG. 1, the next step 112 is to form a pedestal implant. The pedestal implant forms the deeper part of the collector that provides improved collector resistance while minimizing undesirable collector-base capacitance. The pedestal implant links the buried collector to the subcollector and provides a low resistance path to the subcollector. The pedestal implant may be omitted if the subcollector is made sufficiently close to the surface to connect directly to the collector dopant.

In the preferred embodiment, the pedestal implant is formed by depositing and patterning an implant blocking layer (such as a suitable resist layer), and then selectively implanting the pedestal implant into the NPN area of the transistor. The pedestal implant may include one or more energies and doses such that it is relatively uniform in concentration. Generally it is desirable for the pedestal implant to have between approximately $10^{17}$ and $10^{18}$ atoms/cm$^{-3}$ extending uniformly from the wafer surface to the subcollector.

Figure 7:
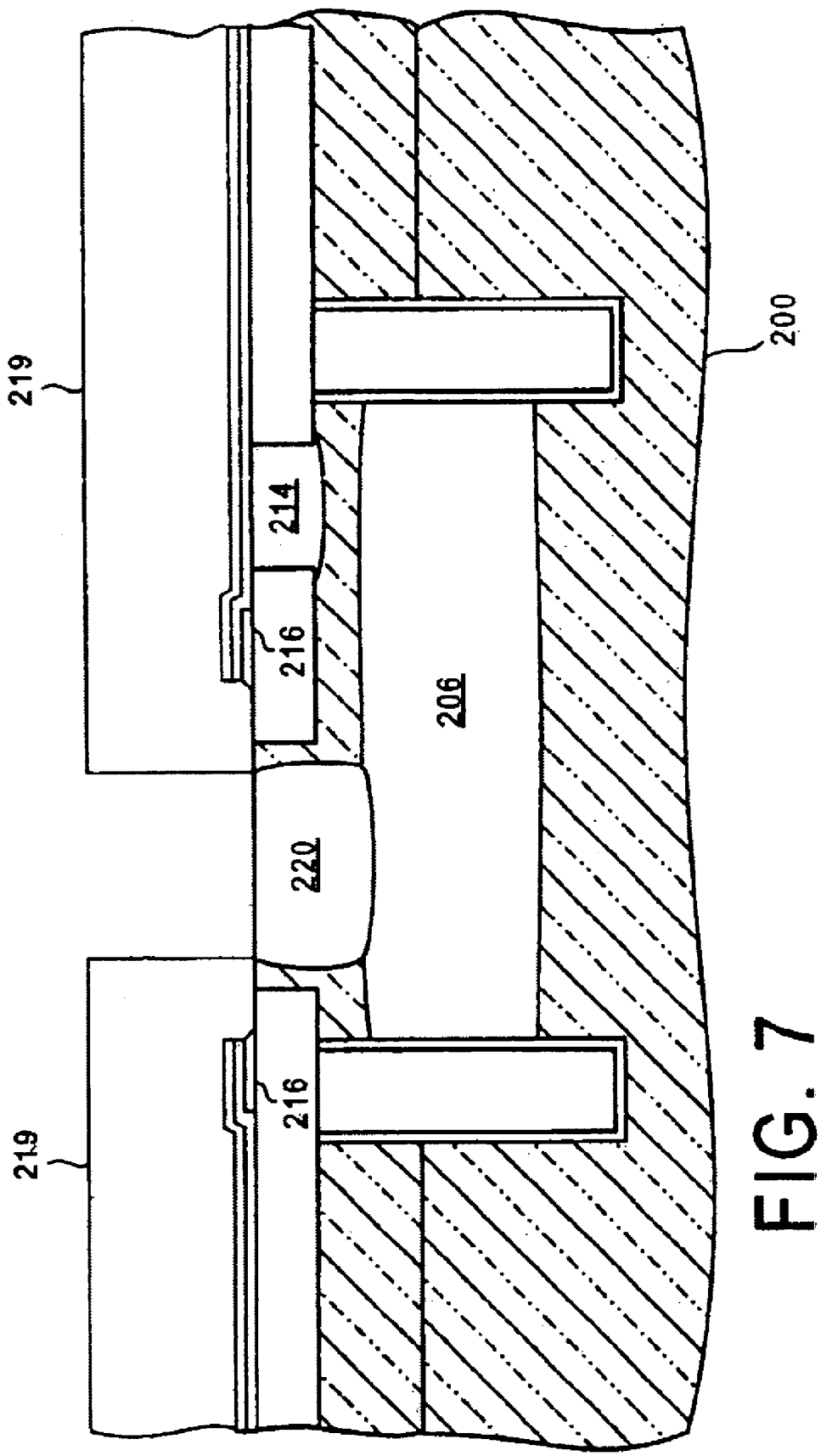

Turning now to FIG. 7, the wafer portion 200 is illustrated after the formation and patterning of an implant blocking layer 219, and the formation of a pedestal implant 220 through the opening in the implant blocking layer 219.

Figure 8:
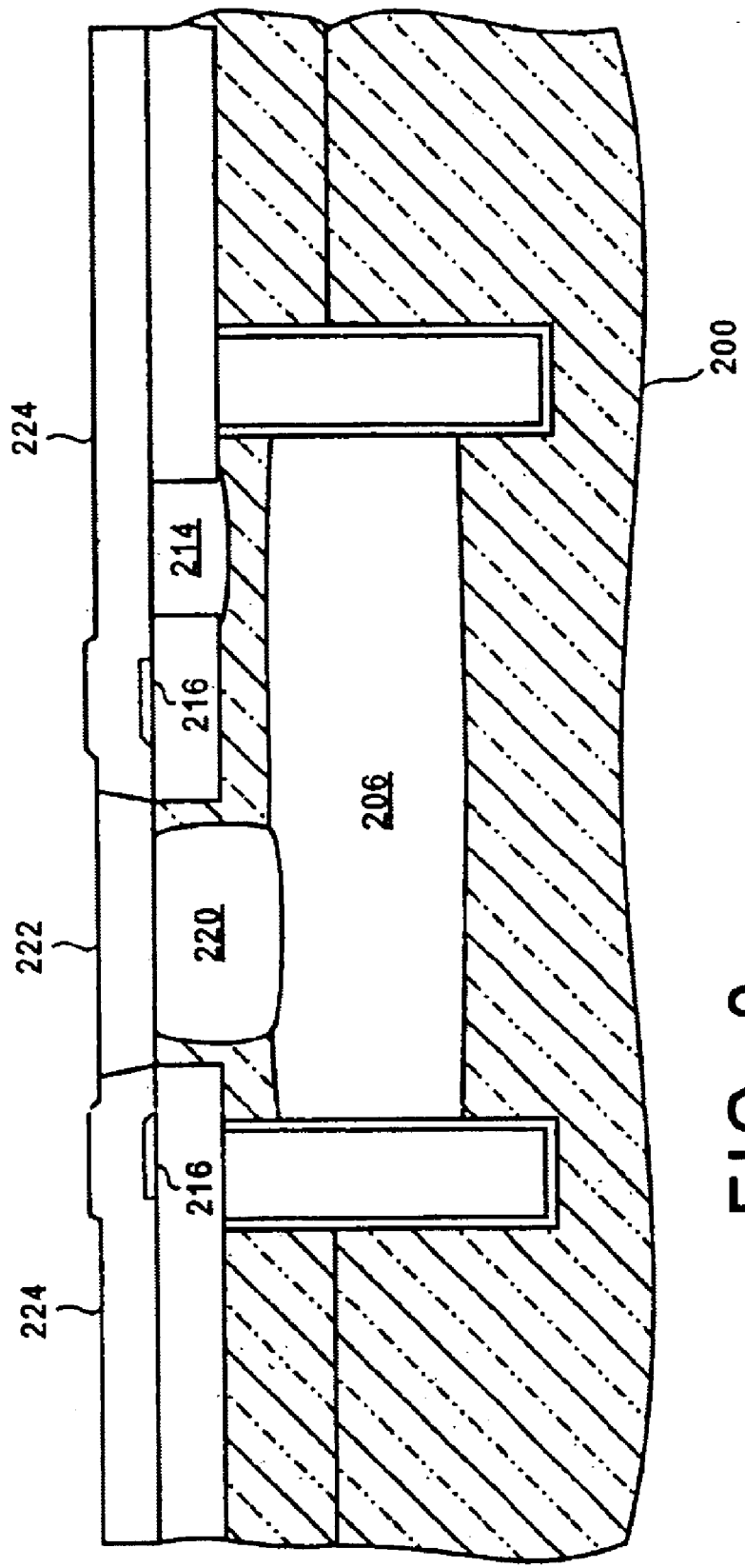

Returning to FIG. 1, the next step 114 is to grow an epitaxial SiGe layer on the wafer substrate. First the implant blocking layer and protective layers are removed, and a low temperature epitaxial (LTE) film growth of Si/SiGe is performed. This forms a single crystal SiGe film layer with the intrinsic base dopant, in the area directly over the exposed NPN region, and a polycrystalline or amorphous film layer in the adjacent portions directly over the shallow trench isolation. These will be used to form the base of the bipolar transistor. In the preferred embodiment, the film is grown to a thickness that is sufficient to separate the p-type base dopants (as deposited or later implanted or diffused) from the n-type pedestal implant, so as to minimize capacitance between these dopant layers. Additionally, the film preferably has a thickness sufficient to fully contain the extrinsic base in the film. With the pedestal dopant 220 at the growth surface, this prevents the extrinsic base from intersecting the collector dopant, this minimizing capacitance. The range of thickness for this film may generally be between 0.1 μm and 0.3 μm. Turning now to FIG. 8, the wafer portion 200 is illustrated after a film growth of Si/SiGe is performed that forms a single crystal SiGe film 222 over the NPN region, and polycrystalline film 224 over the shallow trench isolation regions.

The next step 116 is to form pedestal stack layers. These layers will be used to form a pedestal that will be used to define the emitter opening. The pedestal stack preferably comprises a layer of grown hi-pressure oxide, commonly referred to as hipox, having a thickness of between 100 Angstroms to 200 Angstroms. High pressure oxidation techniques allow for the formation of thicker oxide in the same amount of time and at a lower temperature. The second layer of the pedestal stack preferably comprises a layer of nitride having a thickness of between 100 Angstroms to 300 Angstroms. This layer will be used as an etch stop layer. The third layer of the pedestal stack preferably comprises a thicker layer of oxide. Typically, this layer of oxide can have a thickness of approximately 3500 Angstroms.

Figure 9:
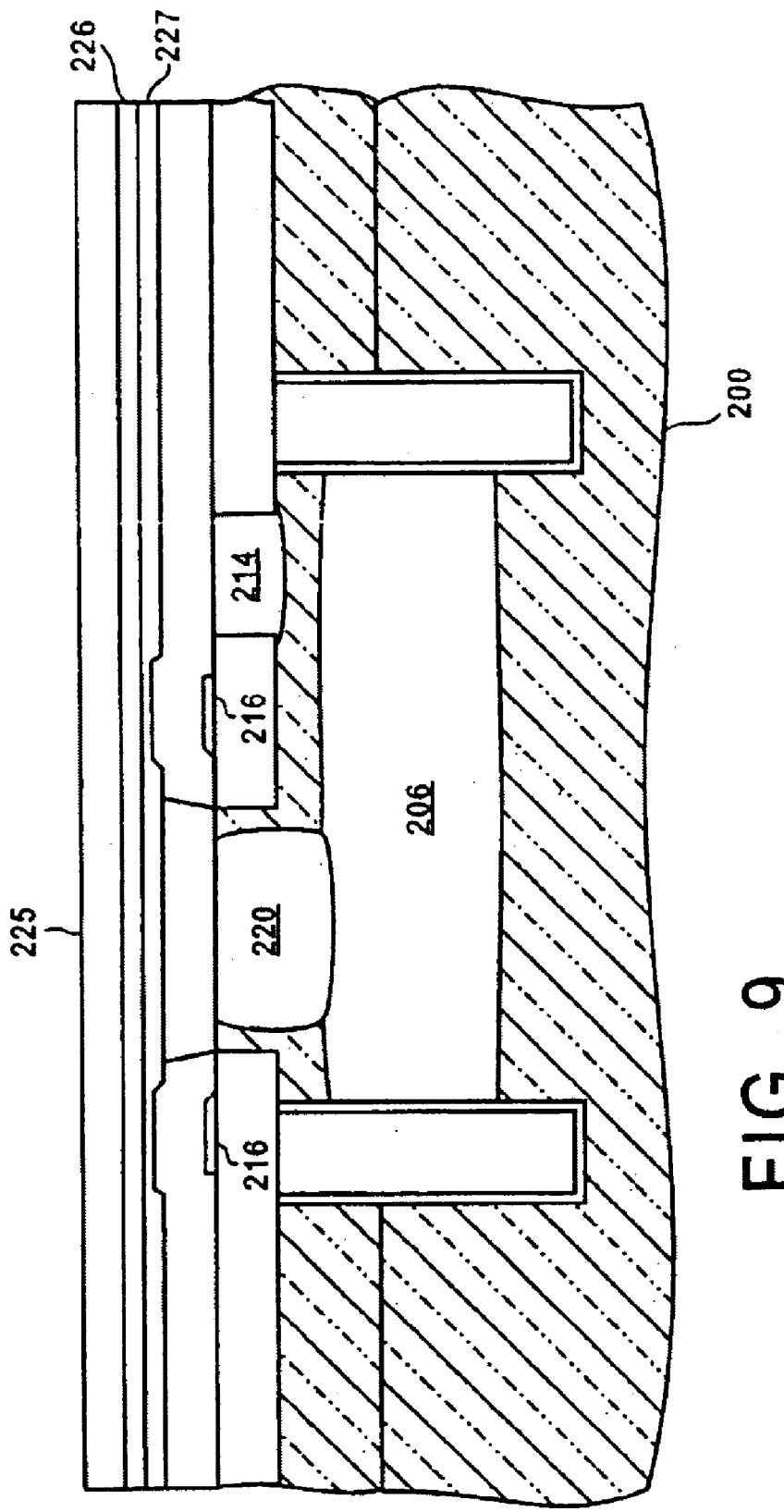

Turning now to FIG. 9, the wafer portion 200 is illustrated after formation of pedestal stack layers that comprise a hi pressure oxide layer 227, a nitride layer 226 and a thicker oxide layer 225. These layers will be used to form the pedestal that will be used to define the emitter opening.

The next step 118 is to pattern the pedestal stack to define the pedestal. This can be done by first depositing and patterning photoresist, and then using the patterned photoresist to etch to the thick oxide layer. The photoresist can then be stripped and the nitride layer pattered selective to the patterned thick oxide layer. The hipox layer can then be patterned while leaving the thick oxide layer using a controlled oxide reaction process that will etch selectively remove the hipox layer while leaving the patterned thick oxide. This completes the patterning of the pedestal stack and results in a pedestal stack that comprises thick oxide, nitride and hipox.

Figure 10:
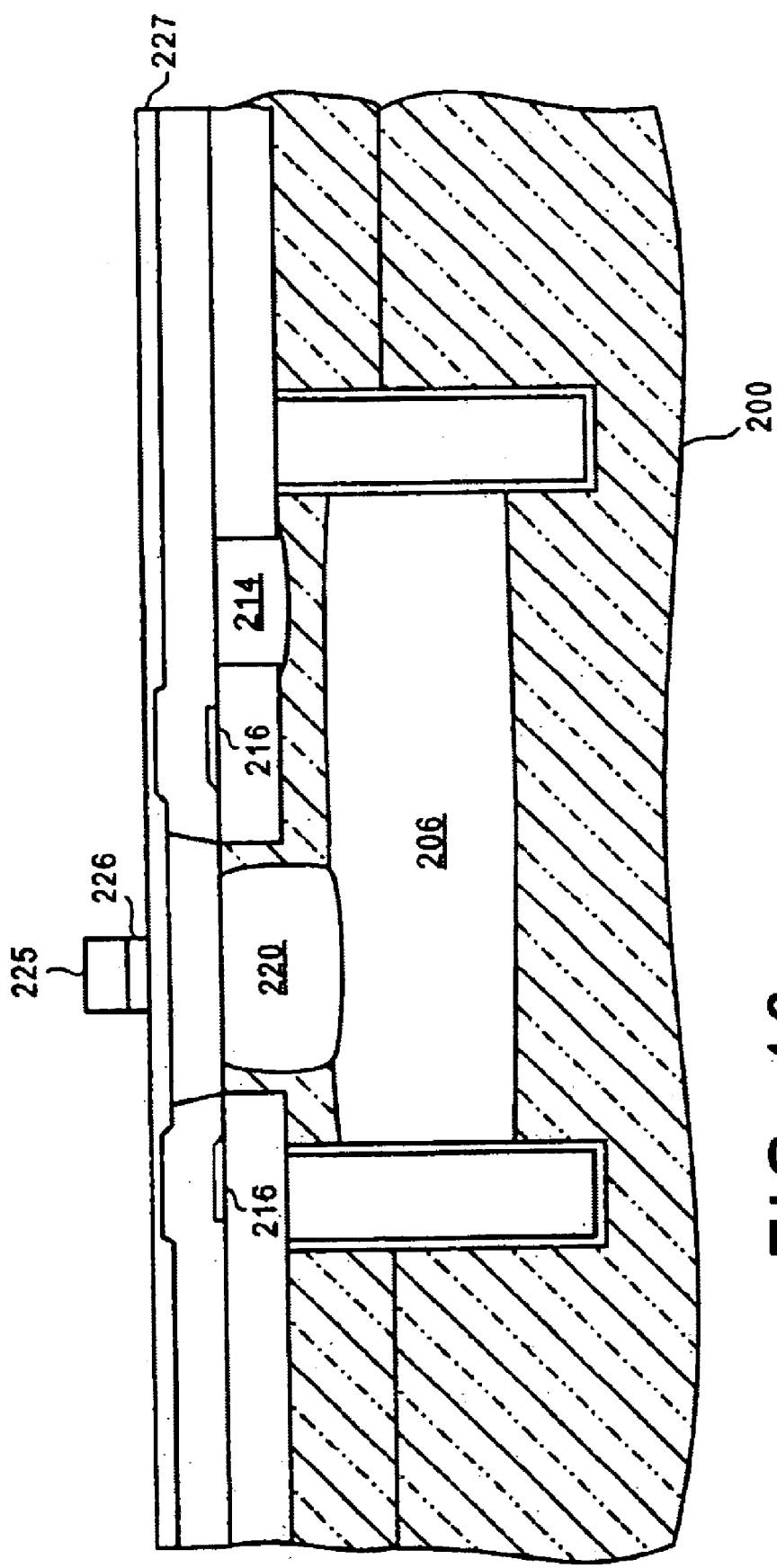
Figure 11:
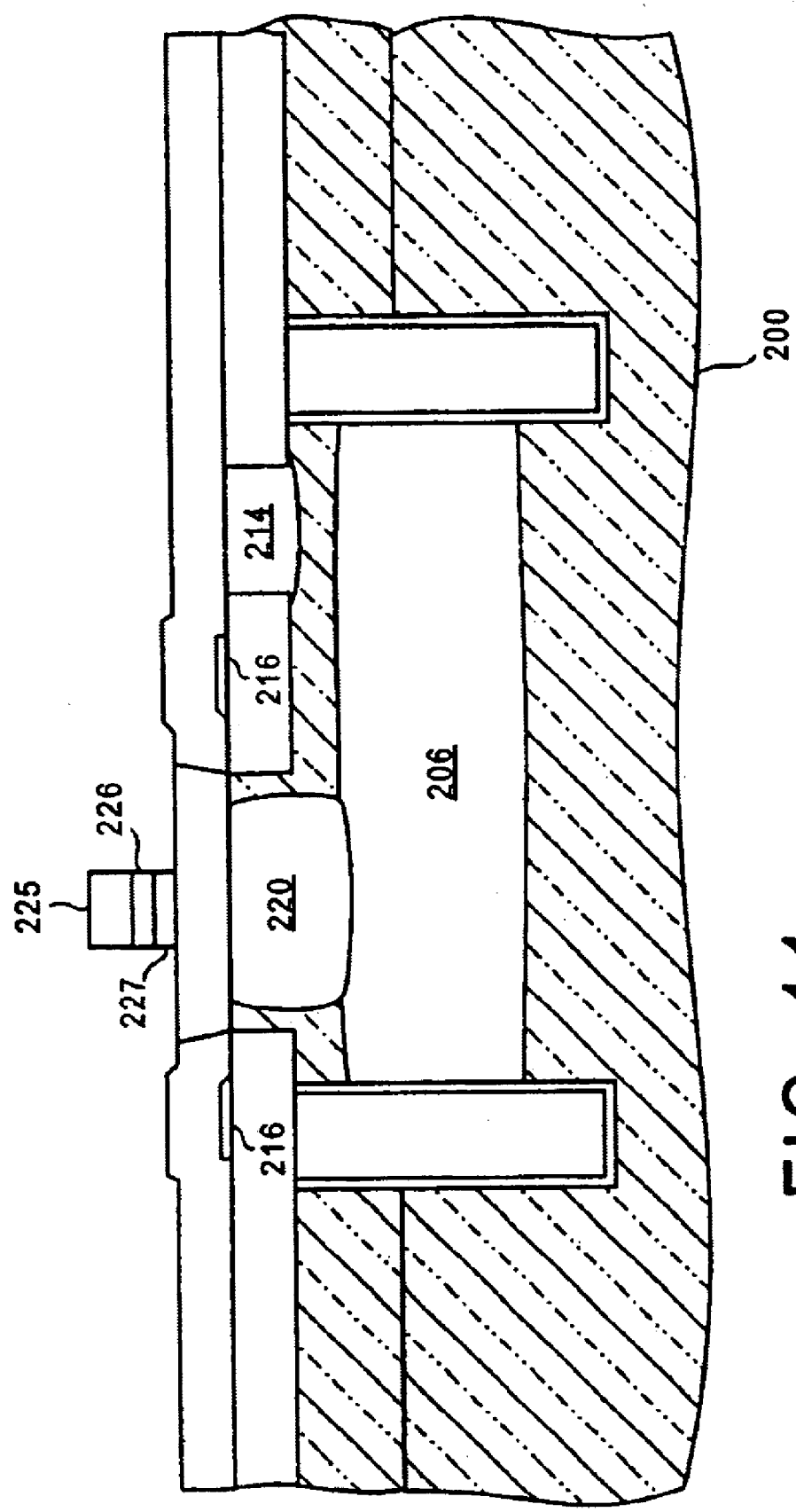

Turning now to FIG. 10, the wafer portion 200 is illustrated after the thick oxide 225 has been patterned, and the nitride layer 226 has been patterned selective to the thick oxide. Turning now to FIG. 11, the wafer portion 200 is illustrated after the hipox layer 227 has been patterned using the controlled oxide reaction process.

The next step 120 is to form a dopant source layer and a cap layer. The dopant source layer will be used to provide the dopants that form at least a portion of the extrinsic base. In particular, in later processing, the dopants will be diffused from the dopant source layer to form at least an inner extrinsic base portion. The dopant source layer can be any suitable layer, such has a doped silicon layer. For example, a layer of between 100 and 200 Angstroms of P++ doped poly or amorphous silicon can be used as the dopant source layer. In this embodiment the dopant source layer can be a selectively grown layer of heavily doped silicon. Preferably, the dopant source layer is grown selectively such that it is formed on the single crystal portions of the SiGe layer and on the amorphous portions of SiGe, but is not formed on the oxide portions of the pedestal. This can be accomplished by stopping the growing process before formation on oxide begins. Standard selective epitaxy techniques known to those skilled in the art may also be used. These methods typically use chlorine based growth chemistries to create a deposition/etch reaction to grow only on silicon exposed areas. The methods are typically employed to create raised source drains FET structures for advanced CMOS devices.

Figure 12:
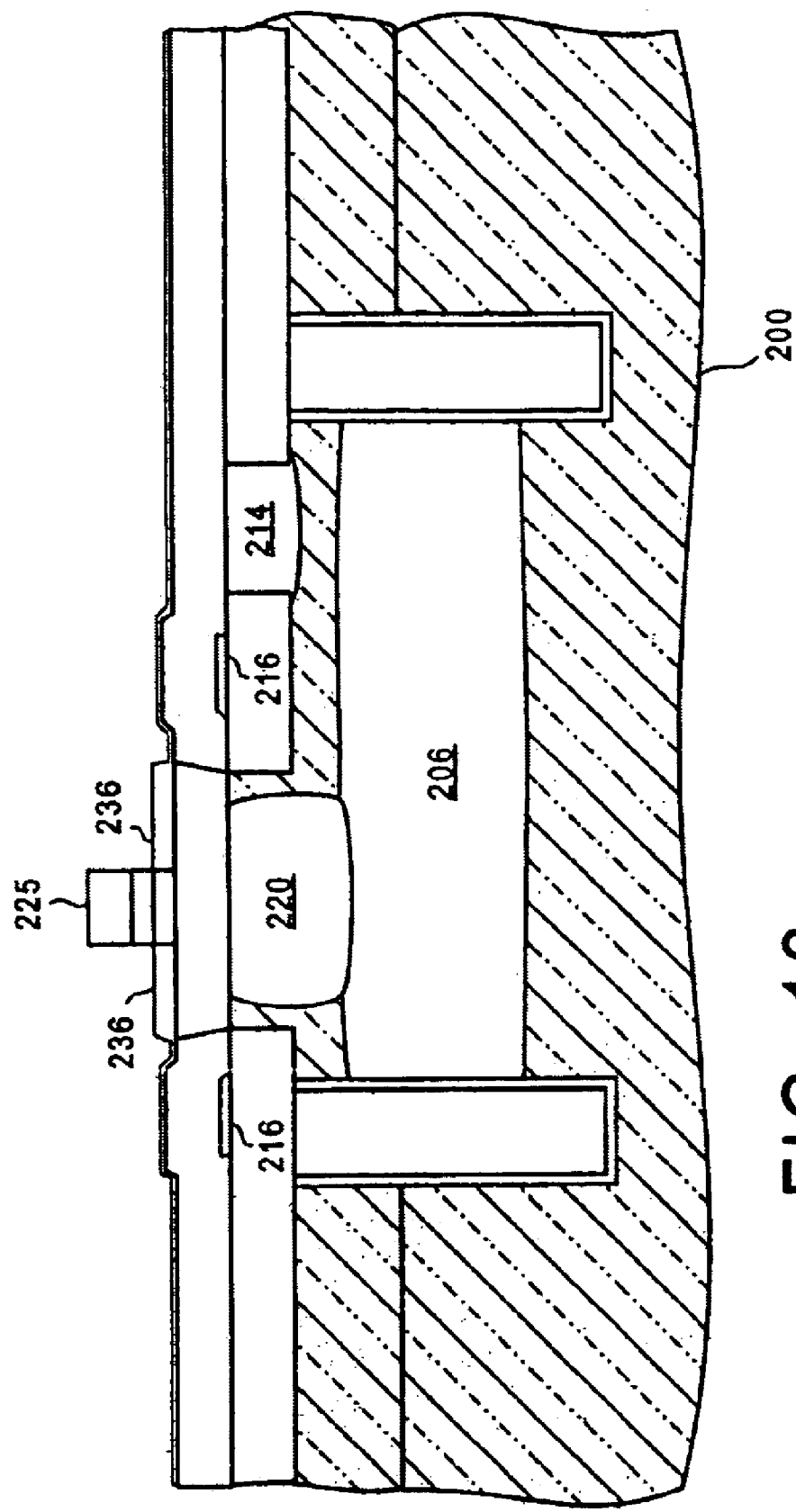
Figure 13:
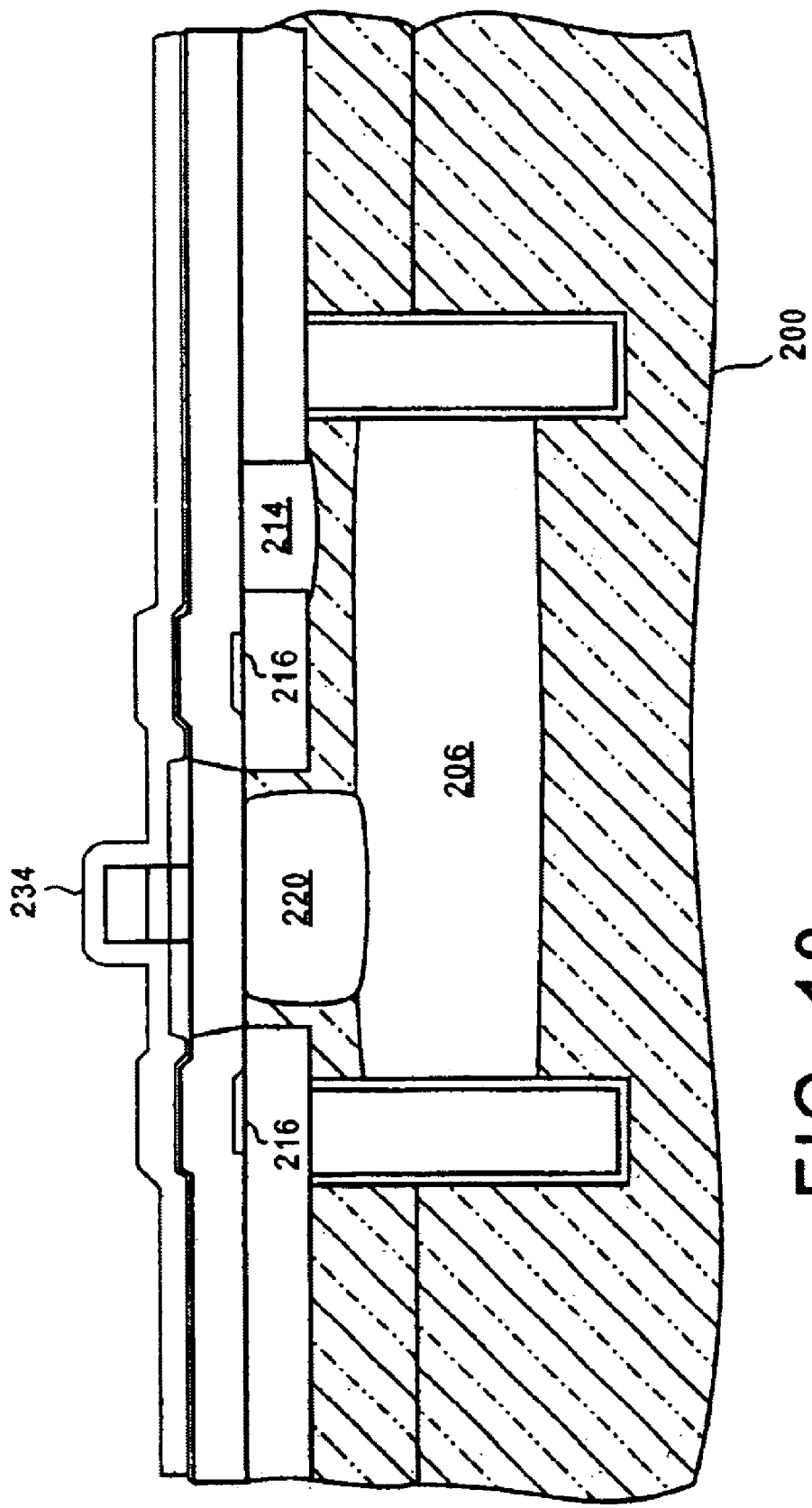

The cap layer acts as an insulator between the p+ extrinsic base dopant source and the n+ emitter polysilicon which will be deposited on top of the cap layer. The cap layer thus helps prevent shorts between the extrinsic base and the emitter. Additionally, the vertical portions of the cap layer will be used to define the emitter opening after the pedestal is removed. The cap layer can be any suitable dielectric material. In one embodiment, the cap layer comprises approximately 1000 Angstroms of conformal silicon nitride deposited over the dopant source layer. Turning now to FIG. 12 the wafer portion is illustrated after the formation of a dopant source layer 236 where the dopant source layer 236 is a grown single crystal silicon layer doped between $5 \times 10^{19}$ and $1 \times 10^{21}$ atoms/cm$^3$, that grows on exposed SiGe surfaces. Turning now to FIG. 13, the wafer portion is illustrated after the formation of a cap layer 234 that comprises a nitride layer.

The next step 122 is form a sidewall spacer, and pattern the cap and dopant source layers. The sidewall spacer is formed on the sidewalls of the cap where the cap covers the pedestal. The sidewall spacer is then used to pattern the underlying dopant sources. These removes the dopant source layer from the outer areas of the transistor, but leaves the dopant source layer where it will be used to form the inner portion of the extrinsic base. The dopant source layers may also be removed outside the spacer during this etch, but need not be. The sidewall spacer can be formed from any suitable material that allows it to be used to pattern the underlying cap and dopant source layer. For example, the sidewall spacer can be formed with silicon dioxide, allowing it to be used to pattern an underlying nitride cap layer and silicon dopant source layer. The sidewall spacer is preferably defined by conformal deposition of the spacer material, followed by a directional etch of the sidewall spacer material. The directional etch removes the material from the horizontal surfaces, while leaving the material on vertical surfaces. Of course, other suitable methods of forming a sidewall spacer could also be used. After the sidewall spacer has been formed, the underlying cap and dopant source layers can then patterned using any suitable etch, preferably one that is selective to the sidewall spacer material. The spacer width may vary between 1000 Angstroms to 8000 Angstroms with a preferred width of 3000 Angstroms. This spacer pushes out the future extrinsic base implant to a distance such that it does not cause implant enhanced diffusion of the intrinsic base.

Figure 14:
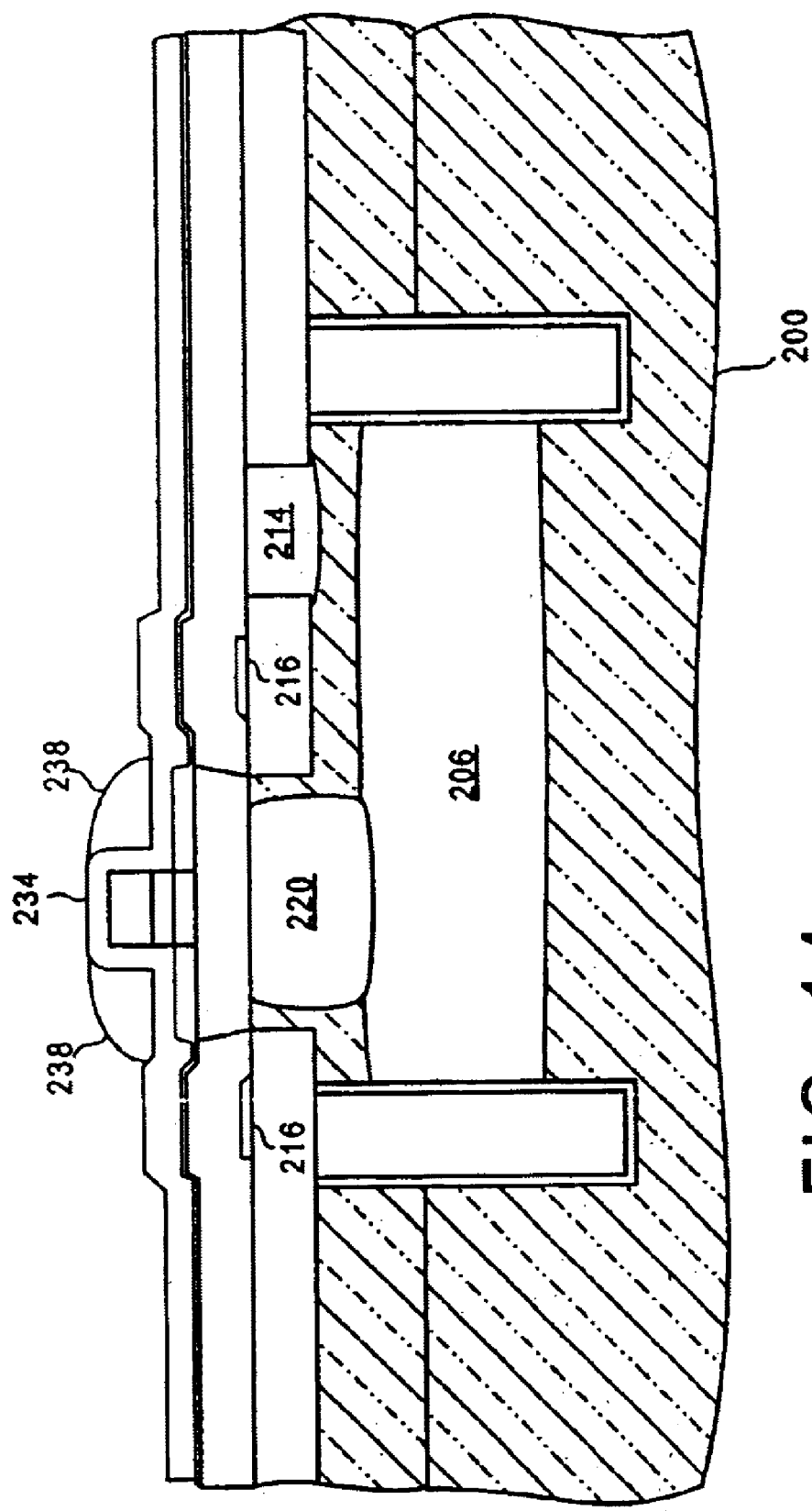
Figure 15:
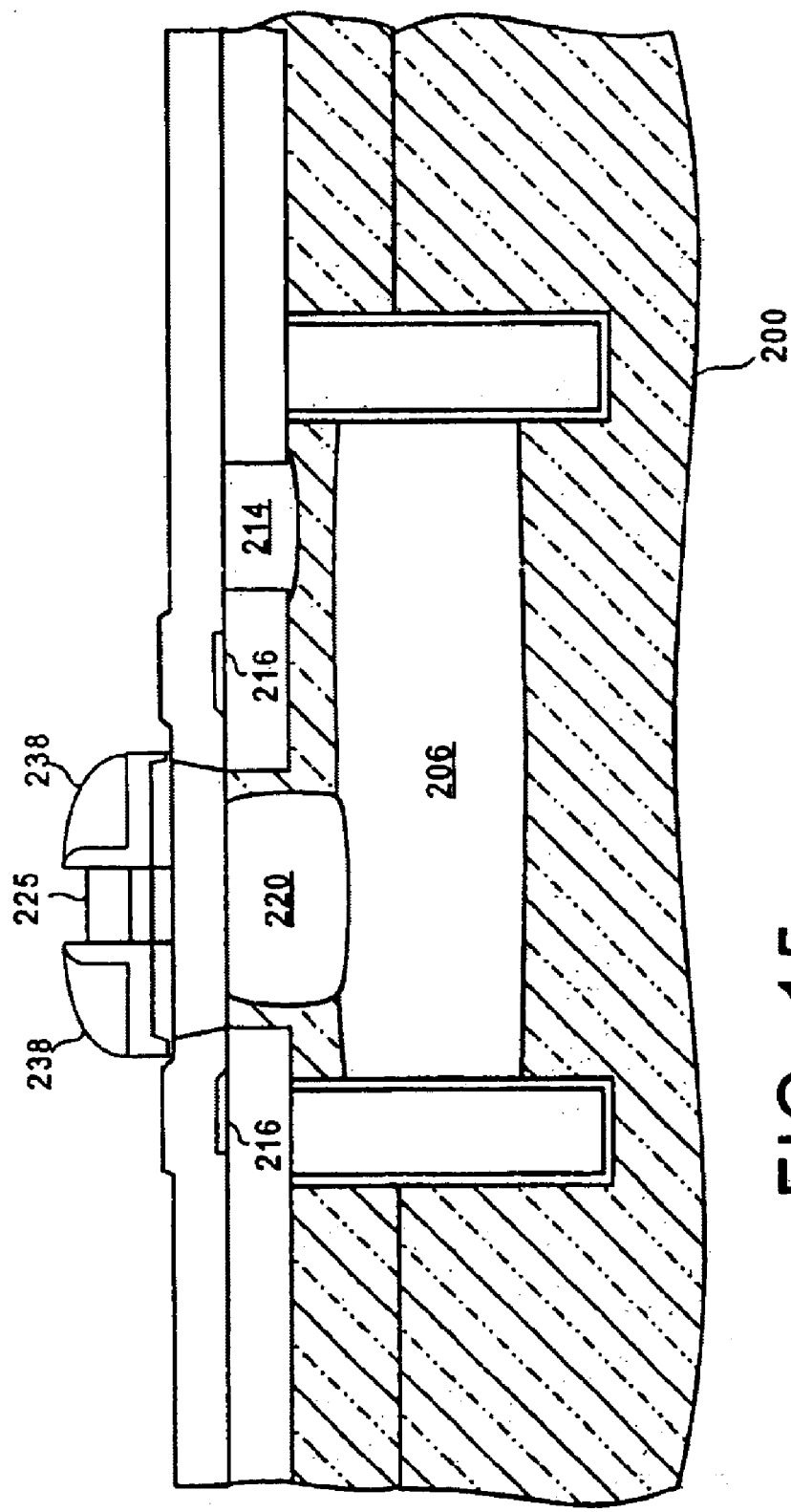

Turning to FIG. 14, the wafer portion 200 is illustrated after the formation of a sidewall spacer 238 on the cap layer 234. Again, the sidewall spacer 238 preferably comprises a material such silicon dioxide that can be used to pattern the underlying cap layer 234 and dopant source layer 236. Turning now to FIG. 15, the wafer portion 200 is shown after the cap layer 234 and the dopant source layer 236 have been patterned using the sidewall spacer 238 as an etch block. This patterning has removed the cap layer 236 and the dopant source layer 236 from the outer regions of the transistor. It has also removed the exposed top portion of the cap layer 236 between the sidewall spacers, exposing the thick oxide portion 225 of the pedestal. Again, it should be noted that it is not required to remove the dopant source layer during this etch.

Returning to method 100, the next step 120 is to implant the outer portion of the extrinsic base, with the inner portion to be formed later by dopant diffusion. The extrinsic base implant will be partially blocked by remaining sidewall spacers and the pedestal, and thus be formed only in the outer areas of the base. The remaining portions of the extrinsic base will then be formed by diffusion from the dopant source layer. This implant would typically comprise a P+ implant selected to minimize the resistance of the extrinsic base. It should be noted that this implant is not required in many cases. For example, if the extrinsic base is to be silicided at the end of the process, or if the implant encroaches too close to the intrinsic base, this implant may be skipped and the transistor optimized without it. For transistors that do include it, the conditions would be very similar to a PFET source/drain implant, namely a Germanium preamorphization implant followed by a high dose/low energy boron dopant implant.

Figure 16:
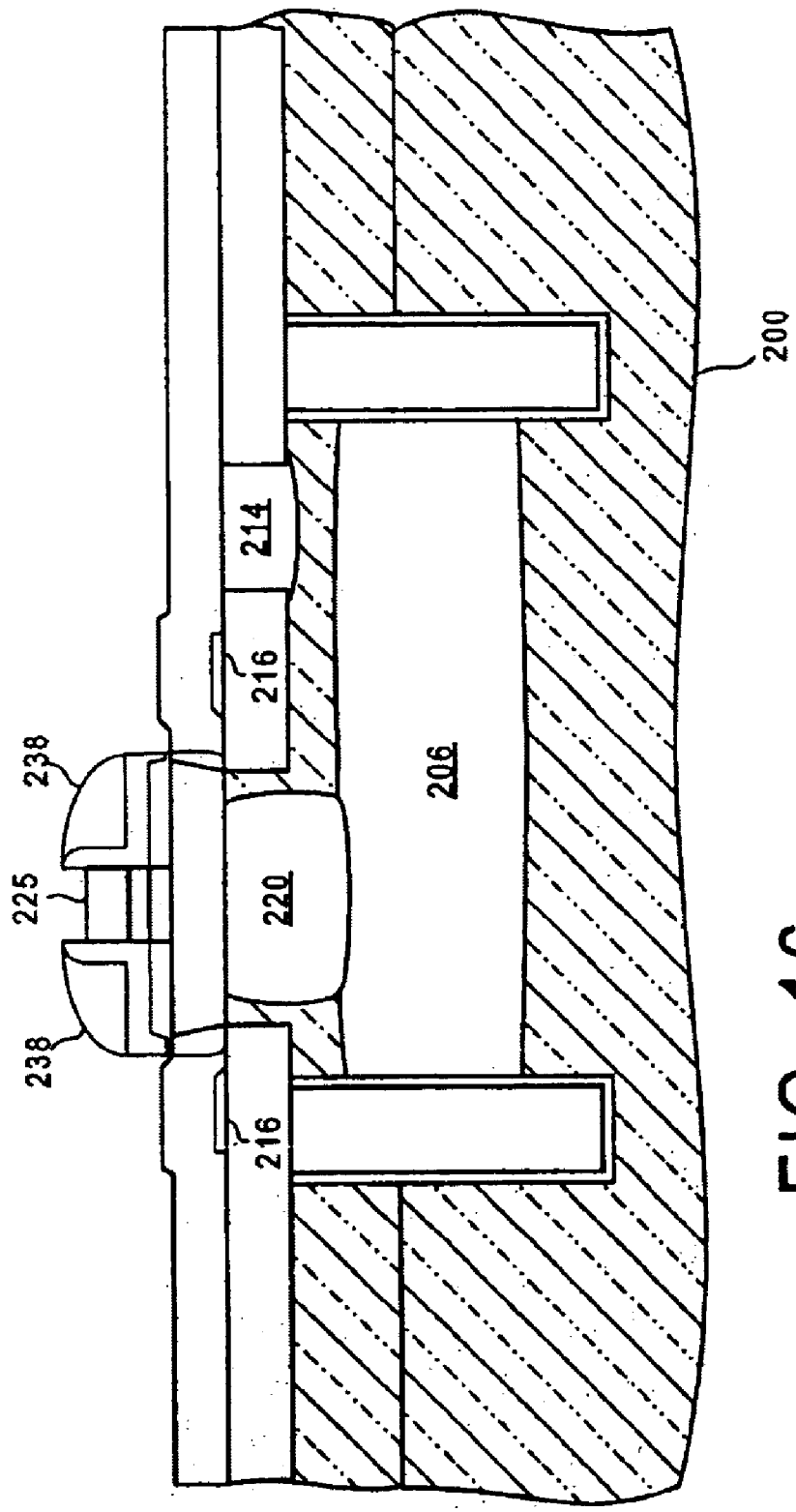

Turning FIG. 16, the wafer portion 200 is illustrated after the implantation of the outer portion of the extrinsic base 240 into the polycrystalline portion of the SiGe 224. The outer portion of the extrinsic base 240 is formed only in areas not blocked by the sidewall spacer 238 or the pedestal.

Figure 17:
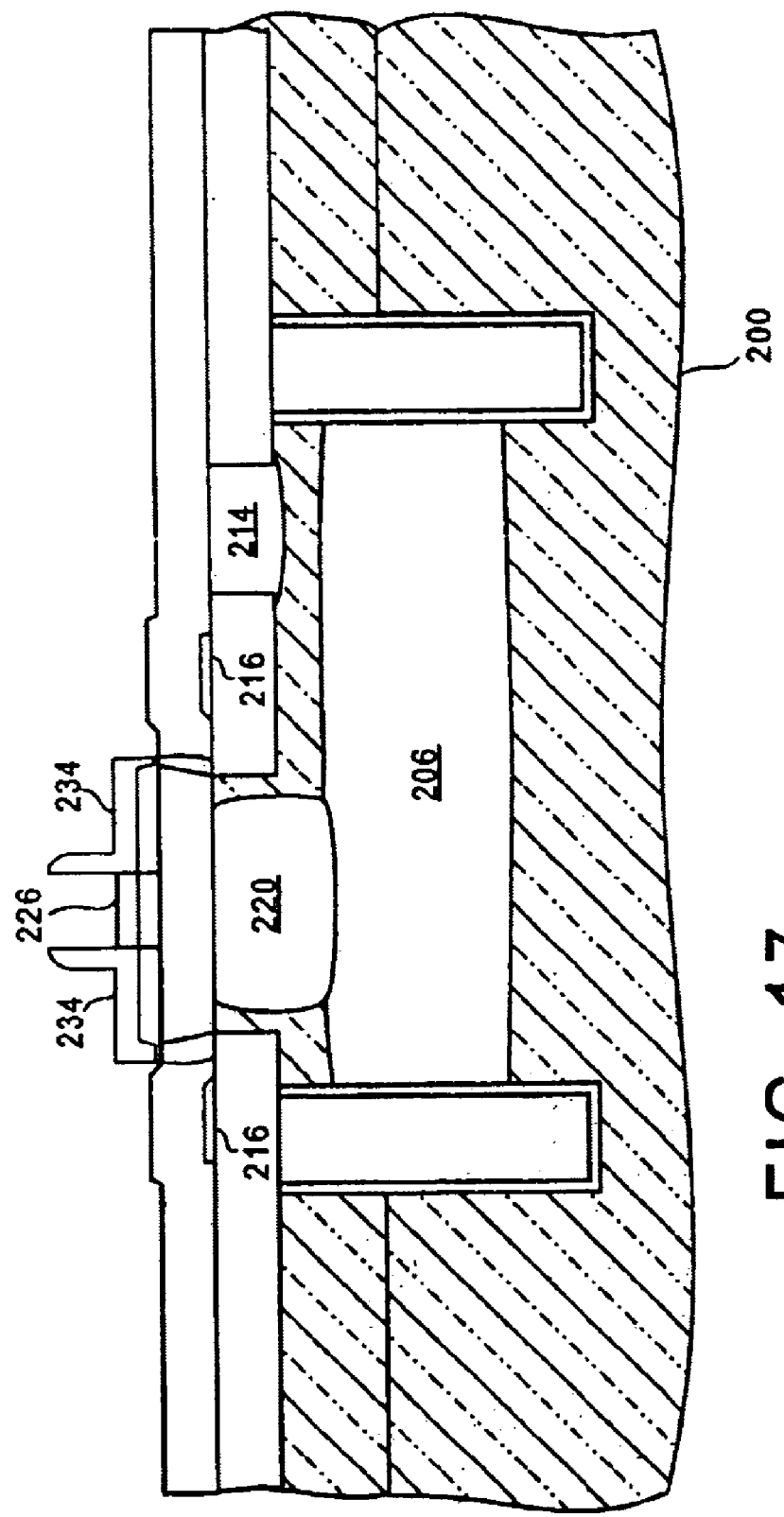

The next step 126 is to remove the top portion of the and pedestal and sidewall spacers. This is preferably using a suitable dip out process. When the sidewall spacers and pedestal comprise silicon dioxide, they are preferably removed using an isotropic wet etch, such as one containing hydrofluoric acid. The removal of the pedestal exposes the nitride portion of the cap. Turning now to FIG. 17, the wafer portion 200 is illustrated after the formation the removal of the oxide portion of the pedestal 225 and the sidewall spacers 238. This removal exposes the nitride portion 226.

The next step 128 is to deposit spacer material and selectively pattern to form spacers and expose the hipox portion of the pedestal. This is preferably done by depositing a suitable thickness of spacer material, such as 500 Angstroms of silicon nitride. Photoresist is then deposited and patterned to selectively expose the emitter area. The spacer material is then directionally etched. This removes the sidewall spacer material from the horizontal surfaces inside the emitter opening. This additionally can remove the exposed layer from the pedestal stack.

In some cases it will be desirable to use the patterned photoresist of this step to define a pedestal collector implant. This facilitates the formation of a pedestal implant that is self aligned to the emitter opening and self aligned with respect to the raised extrinsic base. This enables a reduction in collector base capacitance. This implant can be done before or after the inside nitride spacer etch. Implanting the collector implant to tailor device performance through the emitter opening creates a self-aligned base-collector junction with respect to the emitter-base junction, thus minimizing collector-base capacitance and maximizing $F_{max}$.

Figure 18:
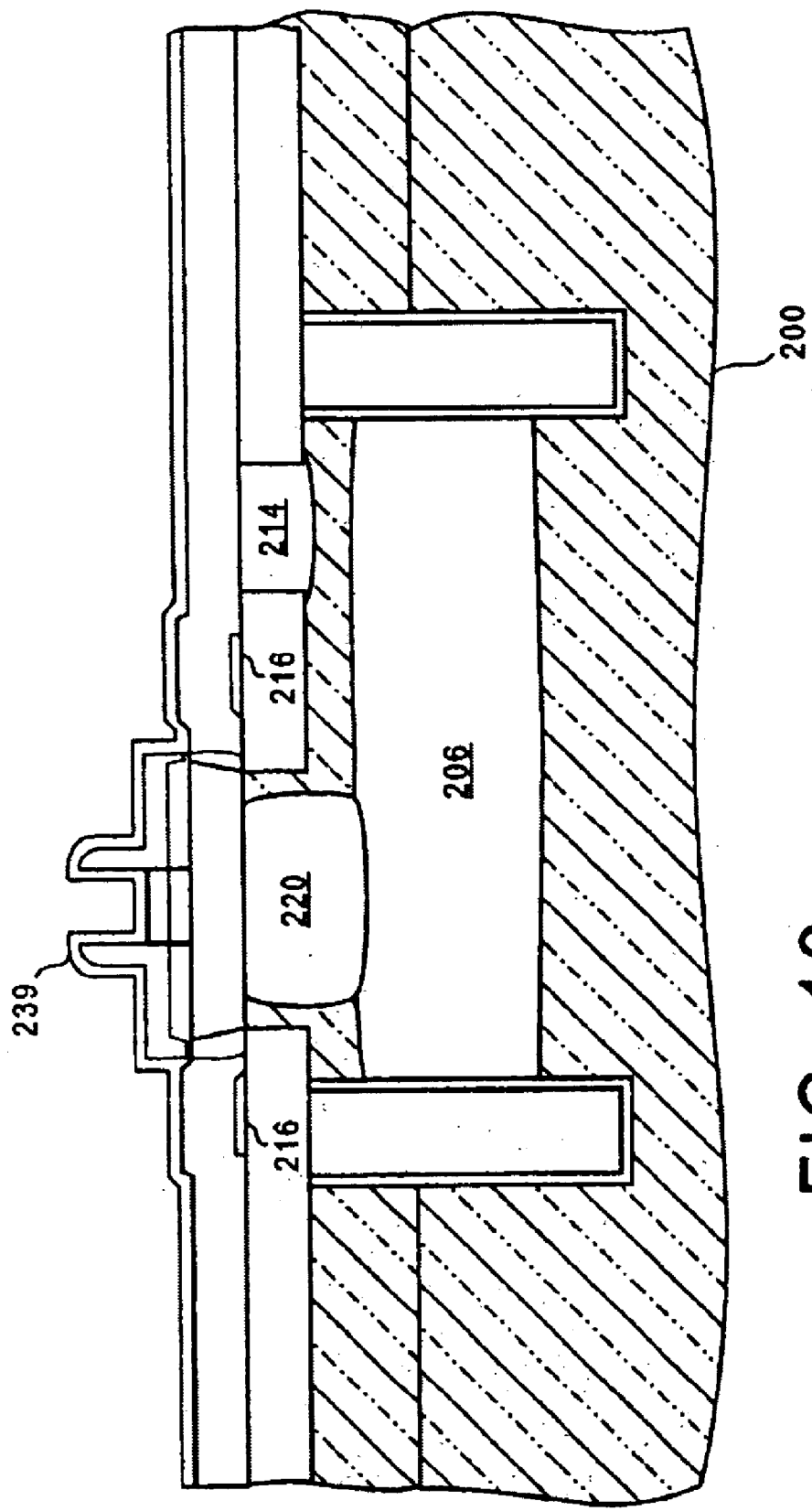
Figure 19:
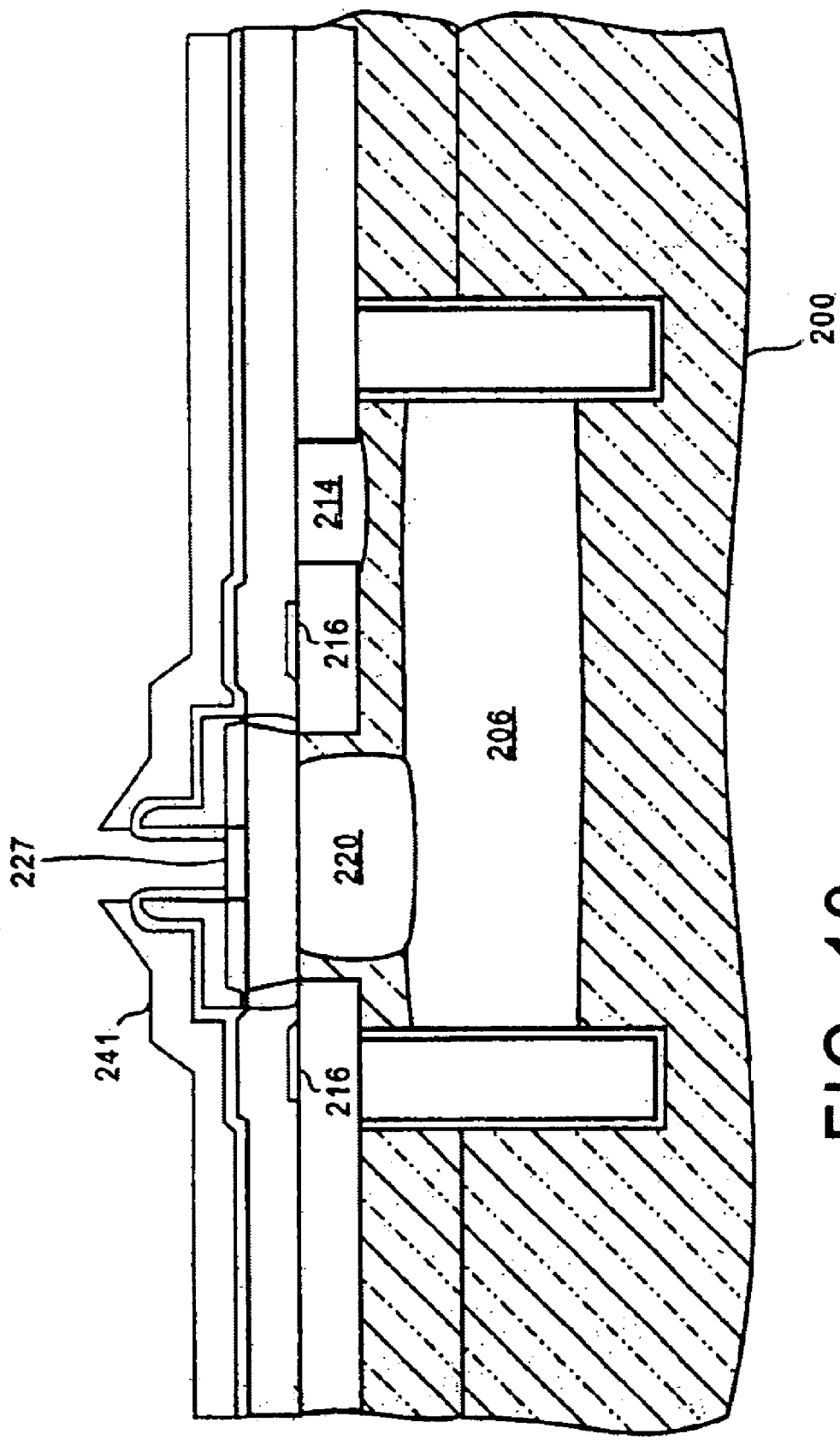

Turning now to FIG. 18, the wafer portion 200 is illustrated after the deposition of spacer material 239. Again, the material can comprise 500 Angstroms of silicon nitride. Turning now to FIG. 19, the wafer portion is illustrated after the deposition and patterning of photoresist 241 to expose the emitter area, and after the spacer material 239 and nitride pedestal layer 226 has been etched away using a suitable directional etch. This exposes the underlying hipox portion of the pedestal 227.

Figure 20:
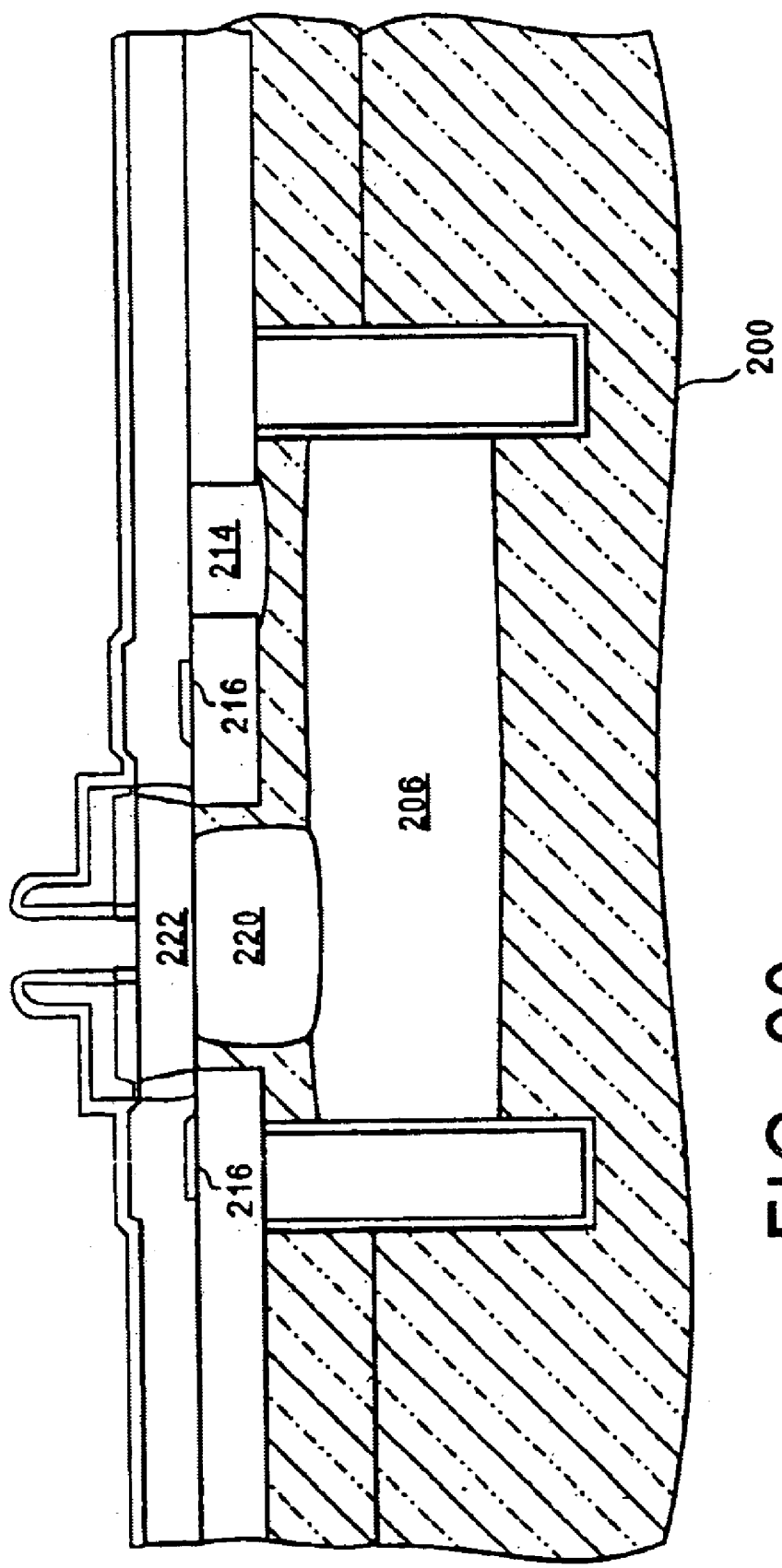

The next step 130 is to remove the remaining pedestal to expose the emitter. This can be done using a suitable dip out process. Turning to FIG. 20, the wafer portion 200 is illustrated after the photoresist 241 has been stripped and the hipox portion of the pedestal 227 has been removed. This exposes the emitter portion of the single crystal SiGe film 222

Figure 21:
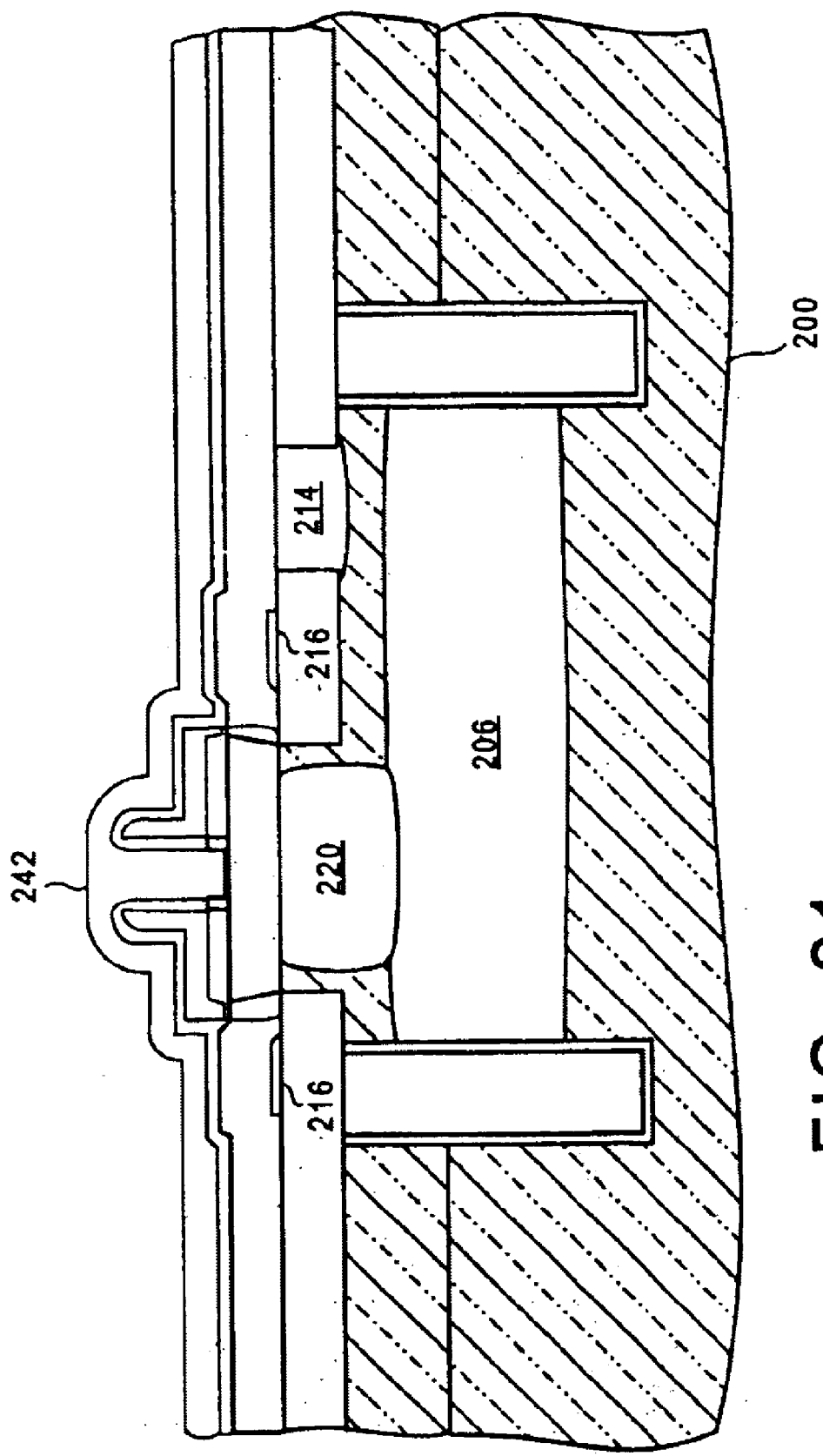
Figure 22:
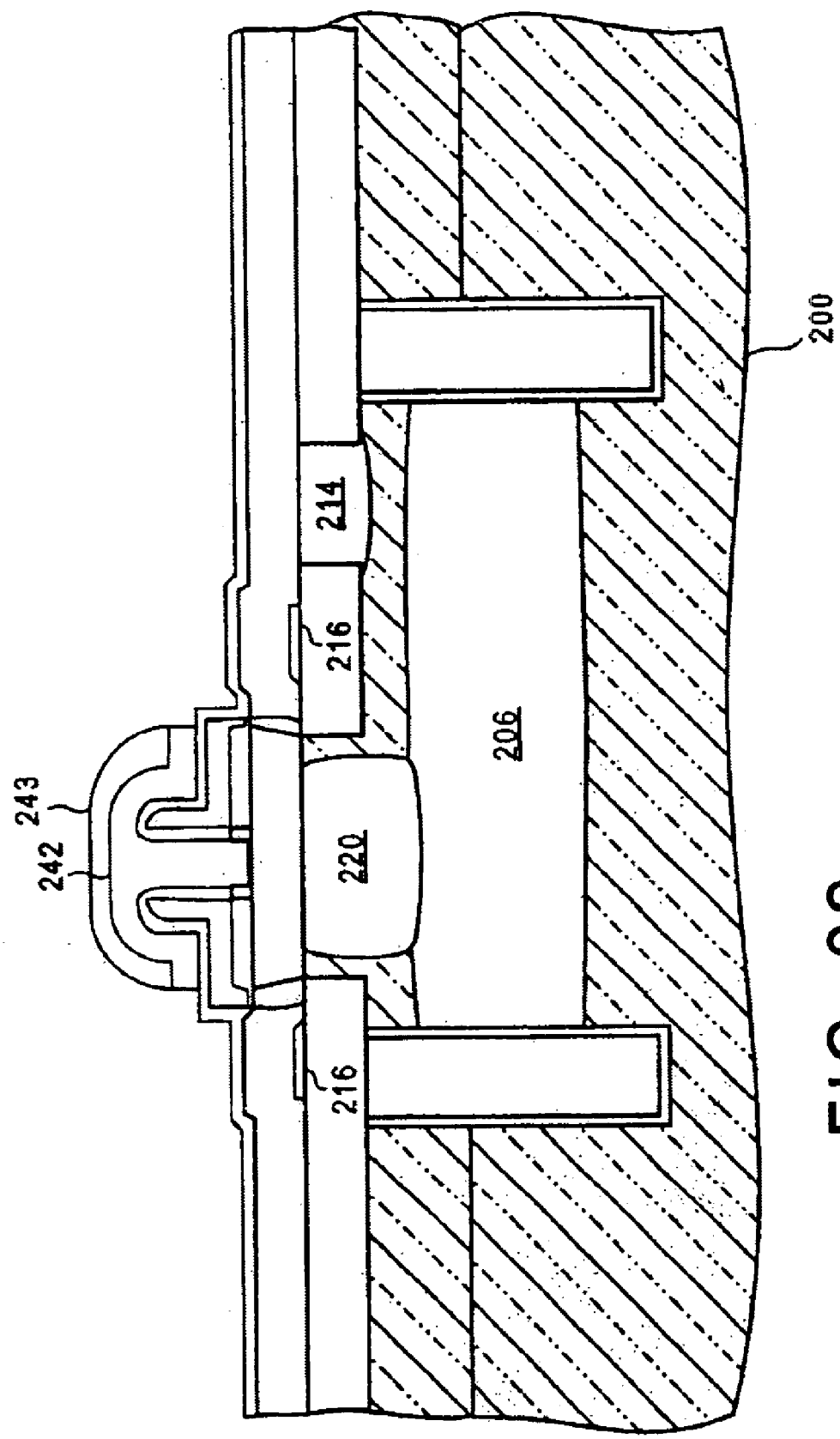

Returning to method 100, the next step 132 is to form the emitter base oxide and deposit and pattern the emitter material. The emitter base oxide can be formed by performing a rapid thermal oxidation of the exposed SiGe The emitter material can then deposited. The emitter material can be a suitable intrinsic polysilicon that is then doped, or formed from in-situ doped polysilicon, or other suitable material. The deposited emitter material can then be patterned to leave emitter material only in the emitter region. This is preferably done by depositing and patterning photoresist, and then patterning the emitter material selective to the photoresist and the underlying cap layer. Turning now to FIG. 21, the wafer portion is illustrated after the formation of the emitter base oxide and the deposition of an emitter material 242 such as doped polysilicon. FIG. 22 illustrates the wafer portion 200 after the emitter material 242 has been patterned using a suitable photoresist 243. The emitter material 242 has been removed except in the emitter areas of the transistor. The etch preferably stops on the remaining spacer layer 239. After the emitter material has been patterned, the remaining photoresist 243 can be removed.

Returning to method 100, the next step 134 is to diffuse in the junctions. This is done by performing a suitable annealing process that causes dopants to diffuse from the doped emitter material to form the emitter. Additionally, dopants diffuse from dopant source layer to form at least a portion of the extrinsic base. Because this portion of the extrinsic base is formed by diffusing dopants, it avoids the damage to the device that would be caused by implanting the extrinsic base. This reduced damage enhances dopant diffusion into the intrinsic base. Additionally, the formed extrinsic base can have improved resistance, resulting in an improved maximum frequency for the bipolar device. Additionally, the remaining portions of the dopant source layer remain and form a raised portion of the extrinsic base that has improved resistance and provides for the majority of current flow through the extrinsic base. Because the raised extrinsic base is built above the intrinsic base, the collector-base junction capacitance will be reduced over that of a conventional NPN, thus resulting in higher $F_{max}$. In an implant extrinsic base, three is less control over the depth of the extrinsic base implant and it is deeper, which results in higher base-collector capacitance and lower $F_{max}$.

Figure 23:
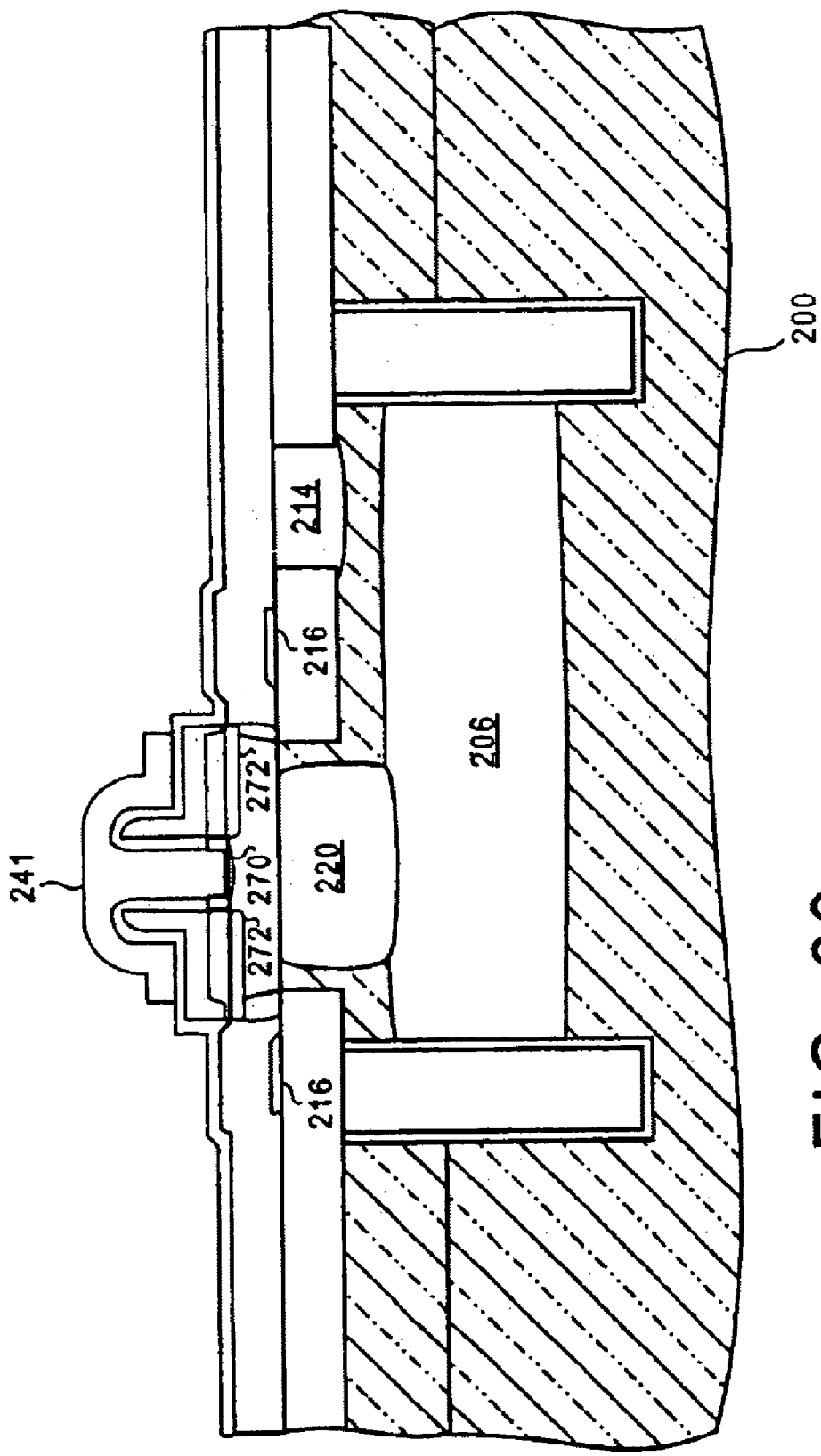

Turning now to FIG. 23, the wafer portion 222 is shown after the emitter 270 and a portion of the extrinsic base 272 have been formed by diffusing dopants from the emitter material 242 and the dopant source layer 236. The diffused portion of the extrinsic base 272 connects the remaining portions of the dopant source layer which comprises a raised extrinsic base that has improved resistance and provides for the majority of current flow through the extrinsic base.

The next step 134 is to finish the transistor and complete back end of line processing. This can include the formation of suicide to improve conductivity, and s standard back end of line processing can be used to form the connections between devices.

Figure 24:
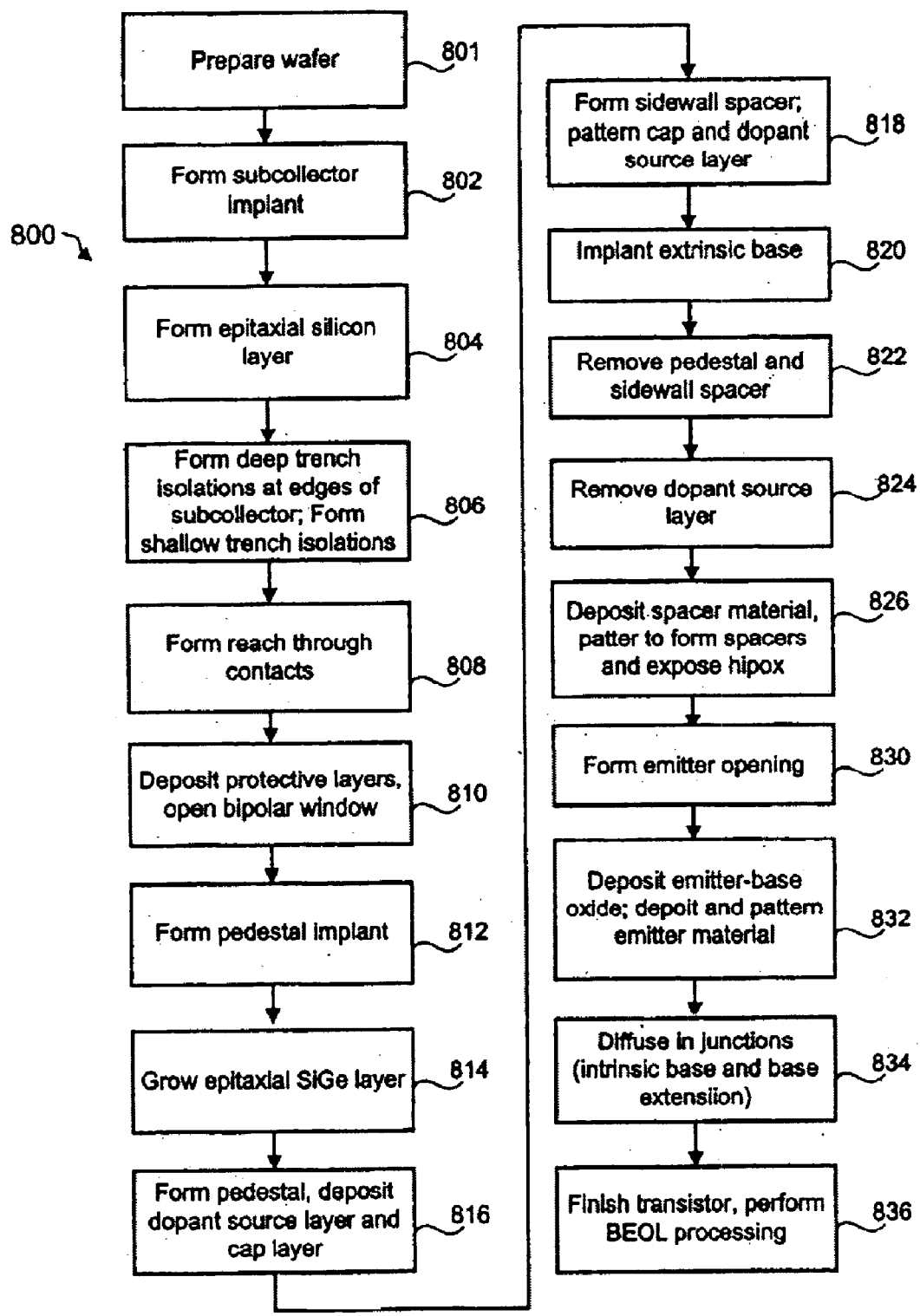
FIG. 24 is a flow diagram illustrating a second method in accordance with the present invention.

Turning now to FIG. 24, a second method 800 for forming an integrated circuit in accordance is illustrated. This method is essentially identical to the first except that it does not use the selective deposition of the raised extrinsic base as the first preferred embodiment.

Steps 801 through 814 of method 800 track parallel steps 101 through 114 in method 100. The next step 816 is to form a pedestal, deposit a dopant source layer and a cap layer. The pedestal will be used to define the emitter opening, and in this method is formed by depositing a dielectric such as silicon dioxide and then patterning the oxide to form the pedestal in the location where the emitter is to be formed. Next a dopant source layer is deposited over the wafer. Again, the dopant source layer will be used to provide the dopants that form at least a portion of the extrinsic base. In particular, in later processing, the dopants will be diffused from the dopant source layer to form at least an inner extrinsic base portion. The dopant source layer can be any suitable layer, such has a doped silicon layer. For example, a layer of between 100 and 200 Angstroms of P++ doped poly or amorphous silicon can be used as the dopant source layer. The material used here may be nonselective and thus is deposited over the pedestal, in contrast to the previous process that used selective deposition of the diffusion source.

Figure 25:
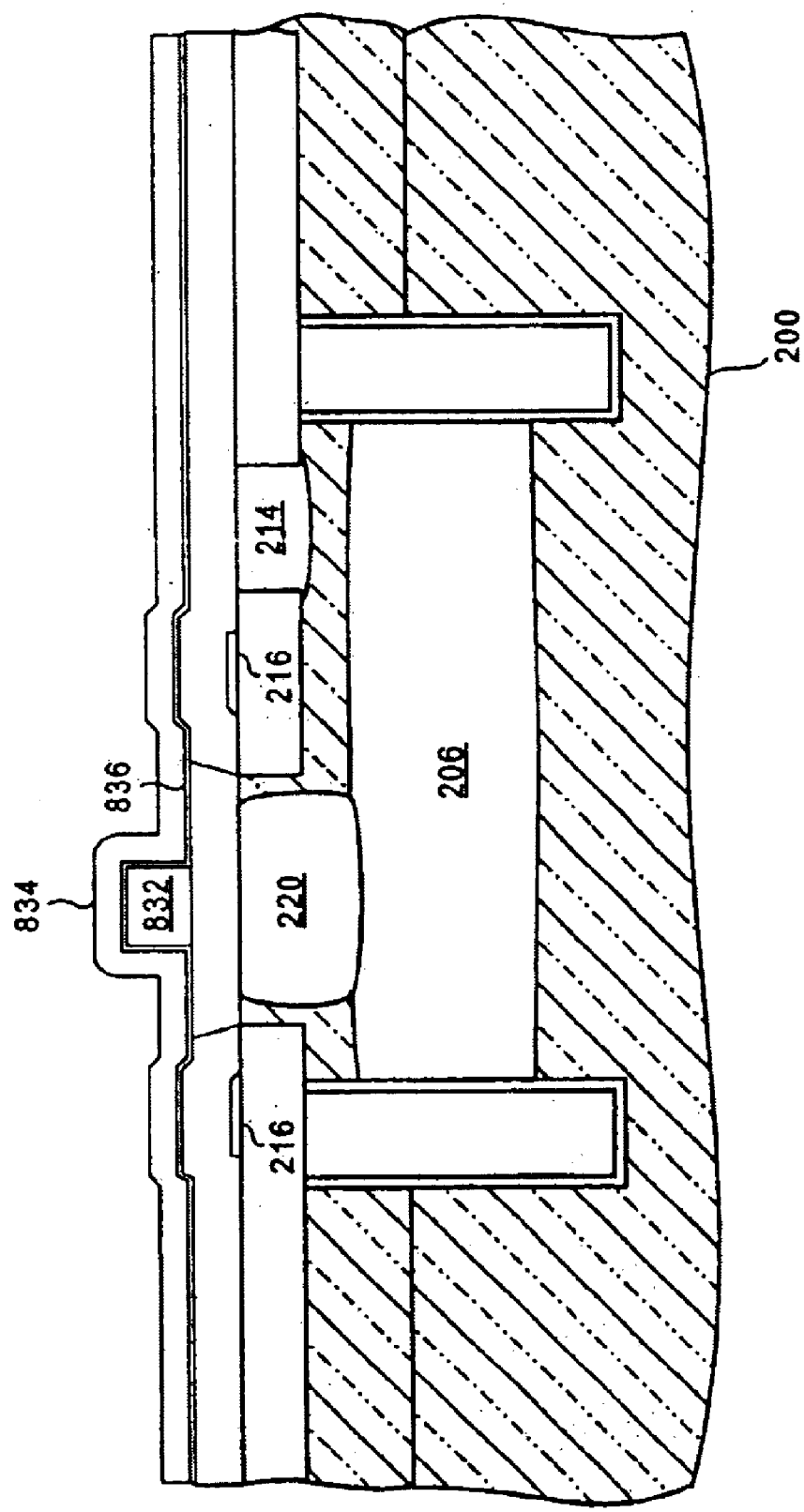
FIGS. 25–35 are schematic cross sections of a wafer substrate illustrating a second embodiment of the present invention.

The cap layer acts as an insulator between the p+ extrinsic base dopant source and the n+ emitter polysilicon which will be deposited on top of the cap layer. The cap layer thus helps prevent shorts between the extrinsic base and the emitter. Additionally, the vertical portions of the cap layer will be used to define the emitter opening after the pedestal is removed. The cap layer can be any suitable dielectric material. In one embodiment, the cap layer comprises approximately 1000 Angstroms of conformal silicon nitride deposited over the dopant source layer. Turning now to FIG. 25 the wafer portion is illustrated after the completion of steps 801 to 814 and the formation of a pedestal 832 by depositing and patterning a suitable oxide layer, and the formation of a of a dopant source layer 836 and a cap layer 834 over the pedestal 832.

The next step 818 is form a sidewall spacer, and patterning the cap and dopant source layers. The sidewall spacer is formed on the sidewalls of the cap where the cap covers the pedestal. The sidewall spacer is then used to pattern the underlying dopant sources. These removes the dopant source layer from the outer areas of the transistor, but leaves the dopant source layer where it will be used to form the inner portion of the extrinsic base. The dopant source layers may also be removed outside the spacer during this etch, but need not be. The sidewall spacer can be formed from any suitable material that allows it to be used to pattern the underlying cap and dopant source layer. For example, the sidewall spacer can be formed with silicon dioxide, allowing it to be used to pattern an underlying nitride cap layer and silicon dopant source layer. The sidewall spacer is preferably defined by conformal deposition of the spacer material, followed by a directional etch of the sidewall spacer material. The directional etch removes the material from the horizontal surfaces, while leaving the material on vertical surfaces. Of course, other suitable methods of forming a sidewall spacer could also be used. After the sidewall spacer has been formed, the underlying cap and dopant source layers can then patterned using any suitable etch, preferably one that is selective to the sidewall spacer material. The spacer width may vary between 1000 Angstroms to 8000 Angstroms with a preferred width of 2000 Angstroms. This spacer pushes out the future extrinsic base implant to a distance such that it does not cause implant enhanced diffusion of the intrinsic base.

Figure 26:
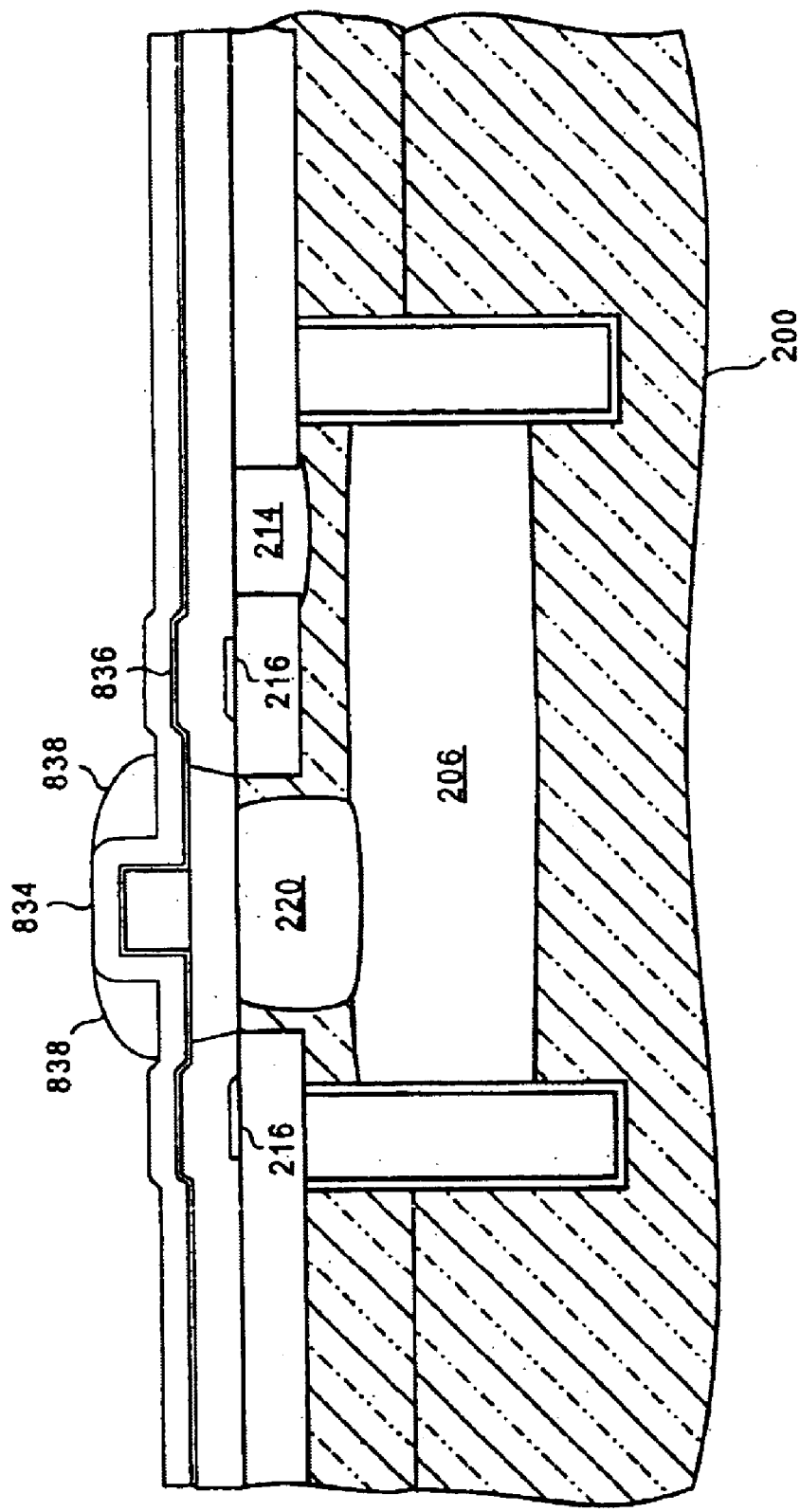
Figure 27:
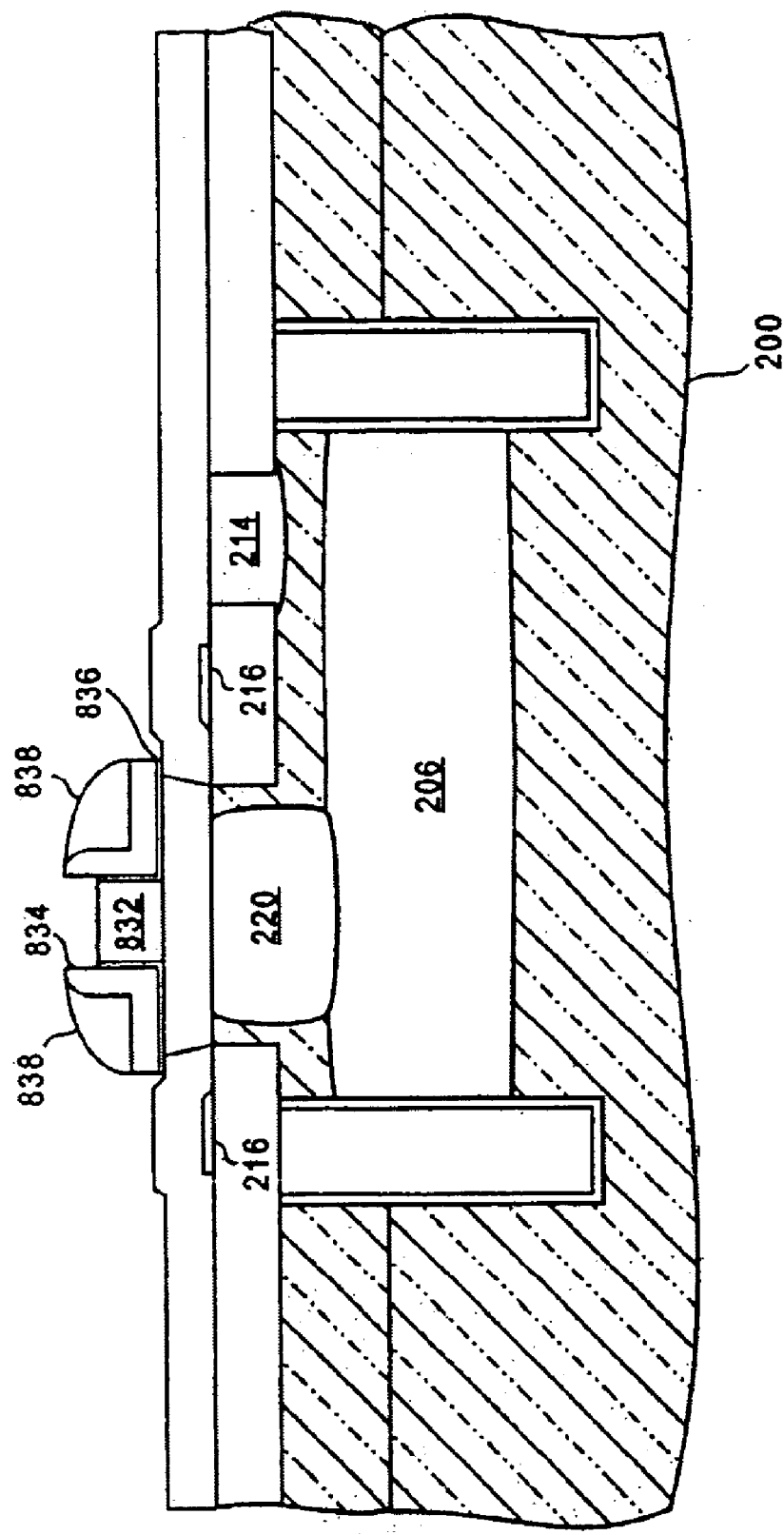

Turning to FIG. 26, the wafer portion 200 is illustrated after the formation of a sidewall spacer 838 on the cap layer 834. Again, the sidewall spacer 838 preferably comprises a material such silicon dioxide that can be used to pattern the underlying cap layer 834 and dopant source layer 836. Turning now to FIG. 27, the wafer portion 200 is shown after the cap layer 834 and the dopant source layer 836 have been patterned using the sidewall spacer 838 as an etch block. This patterning has removed the cap layer 836 and the dopant source layer 836 from the outer regions of the transistor. Again, it should be noted that it is not required to remove the dopant source layer during this etch. Additionally, the cap layer 836 has been removed from the emitter area, exposing pedestal 832.

Returning to method 800, the next step 820 is to implant the extrinsic base. Specifically, to implant the outer portion of the extrinsic base, with the inner portion to be formed later by dopant diffusion. The extrinsic base implant would be partially blocked remaining sidewall spacers and pedestal, and thus be formed only in the outer areas of the base. The remaining portions of the extrinsic base will then be formed by diffusion from the dopant source layer. This implant would typically comprise a P+ implant selected to minimize the resistance of the extrinsic base. This extrinsic base implant would be similar to that described in the first embodiment. It would be a shallow, high dose p type implant very similar to that used in a standard PFET CMOS source/drain.

Figure 28:
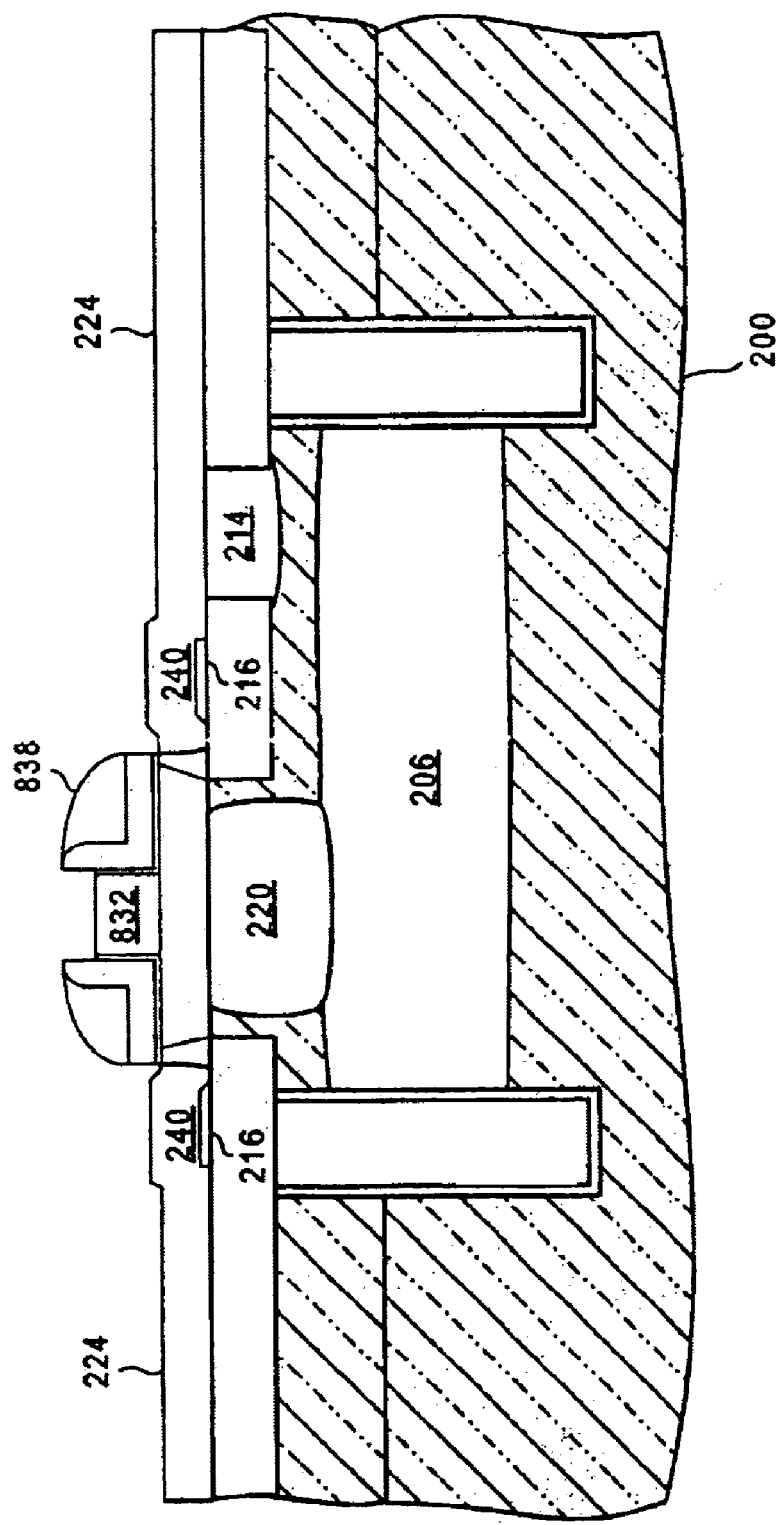

Turning FIG. 28, the wafer portion 200 is illustrated after the implantation of the outer portion of the extrinsic base 240 into the polycrystalline portion of the SiGe 224. The outer portion of the extrinsic base 240 is formed only in areas not blocked by the sidewall spacer 838 or the pedestal 832.

Figure 29:
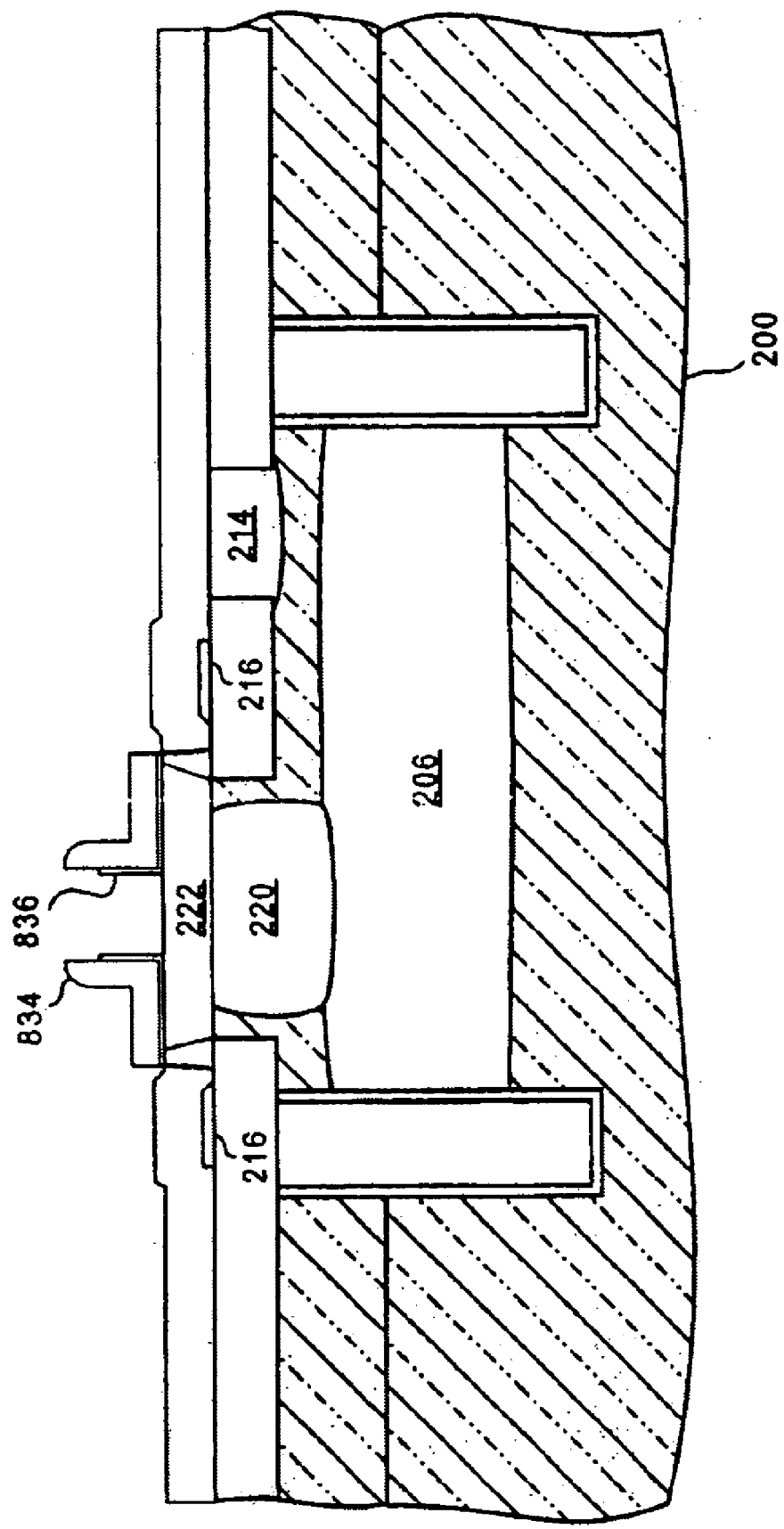

The next step 822 is to remove the pedestal and sidewall spacers. This is preferably accomplished using a suitable dip out process. When the sidewall spacers and pedestal comprise silicon dioxide, they are preferably removed using an isotropic wet etch, such as one containing hydrofluoric acid. The removal of the pedestal exposes the underlying SiGe, exposing the portion where the intrinsic base will later be formed. It also exposes a portion of the dopant source layer. Turning now to FIG. 29, the wafer portion 200 is illustrated after the formation the removal of the pedestal 832 and the sidewall spacers 838. This removal exposes the cap layer 834, and a portion of the dopant source layer 836. It also exposes a portion of the SiGe layer 222.

The next step 824 is to remove the exposed portion of the dopant source layer, which lines the vertical part of the cap. The dopant source layer sandwiched horizontally between the cap and the SiGe epi will remain. The dopant source layer can be removed using any suitable process which removes or renders inactive the dopant layer. When the dopant source layer comprises doped silicon, the removal can comprise a high pressure oxidation process that converts the exposed doped polysilicon to silicon dioxide.

Figure 30:
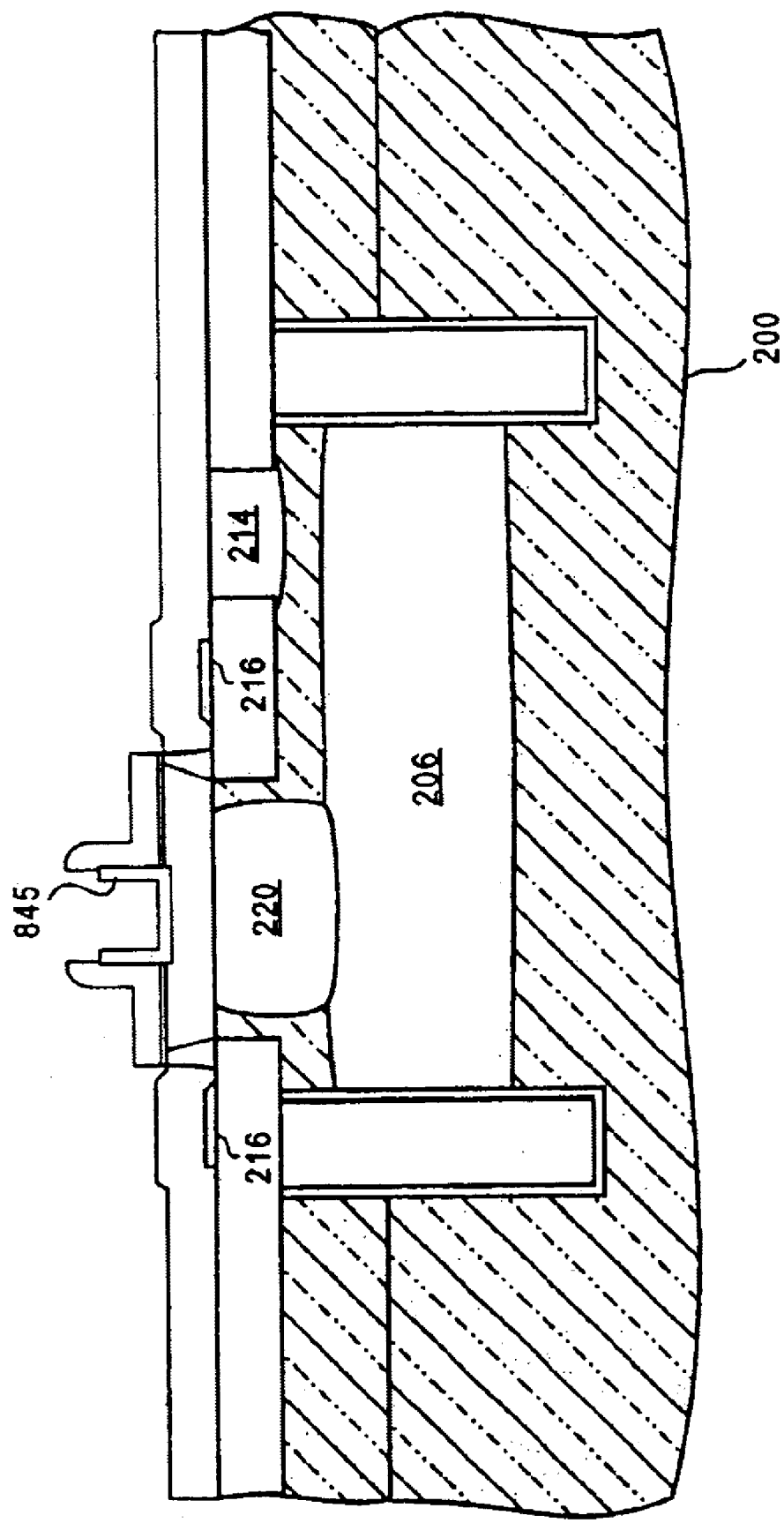

Turning now to FIG. 30, the wafer portion 200 is illustrated after the exposed portion of the dopant source layer 836 has been removed by converting the exposed dopant source layer to a layer silicon dioxide 845. Again, this conversion can be accomplished using a suitable high pressure oxidation process.

The next step 828 is to deposit spacer material and selectively pattern to form spacers and expose the converted dopant source layer. This is preferably done by depositing a suitable thickness of spacer material, such as 500 Angstroms of silicon nitride. Photoresist is then deposited and patterned to selectively expose the emitter area. The spacer material is then directionally etched. This removes the sidewall spacer material from the horizontal surfaces and forms sidewall spacers over the converted dopant source layer.

In some cases it will be desirable to use the patterned photoresist of this step to define a pedestal collector implant. This facilitates the formation of a pedestal implant that is self aligned to the emitter opening and self aligned with respect to the raised extrinsic base. This enables a reduction in collector base capacitance. This implant can be done before or after the inside nitride spacer etch. The proper combination of implant energy and dose, and prior-deposited emitter film thickness must be chosen to optimize the device characteristics. The implant energy and dose is tailored to obtain the proper transistor transit time and breakdown characteristics. The energy should be sufficient to link up with the prior pedestal implant. More than one implant (e.g., shallow and deep) may be required to satisfy these requirements. Energies in the range of 50 to 200 KeV, and doses from $1\times10^{12}$ to $3\times10^{13}$ atoms/cm$^2$ may be used. Resulting doses are in the range of $1\times10^{17}$ to $2\times10^{18}$ atoms/cm$^3$. The prior-implanted pedestal 220 or subcollector should be deep enough (where the depth is defined by the SiGe film growth thickness) to not intersect the extrinsic base dopants, in which case it would dramatically increase the capacitance.

Figure 31:
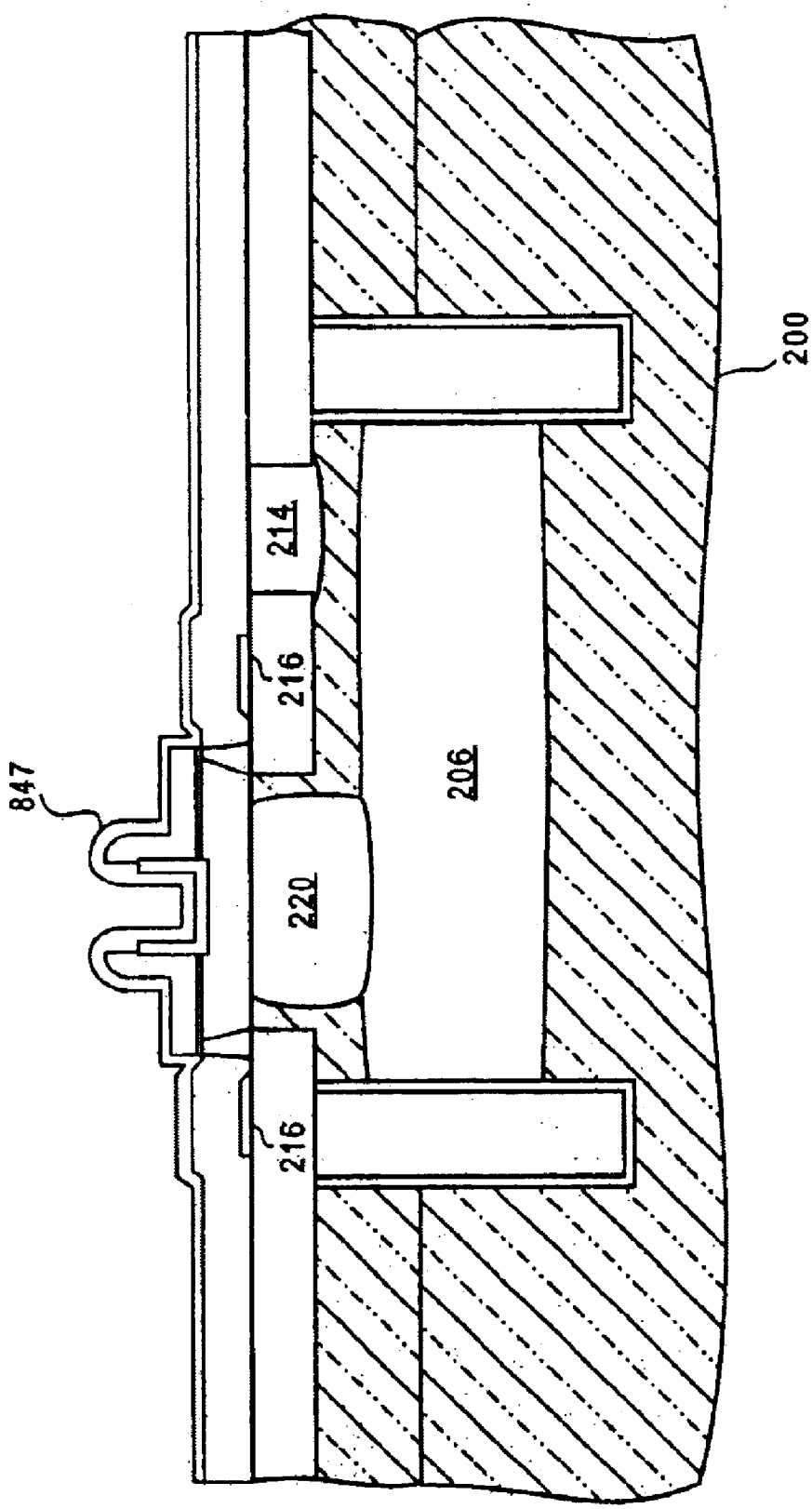
Figure 32:
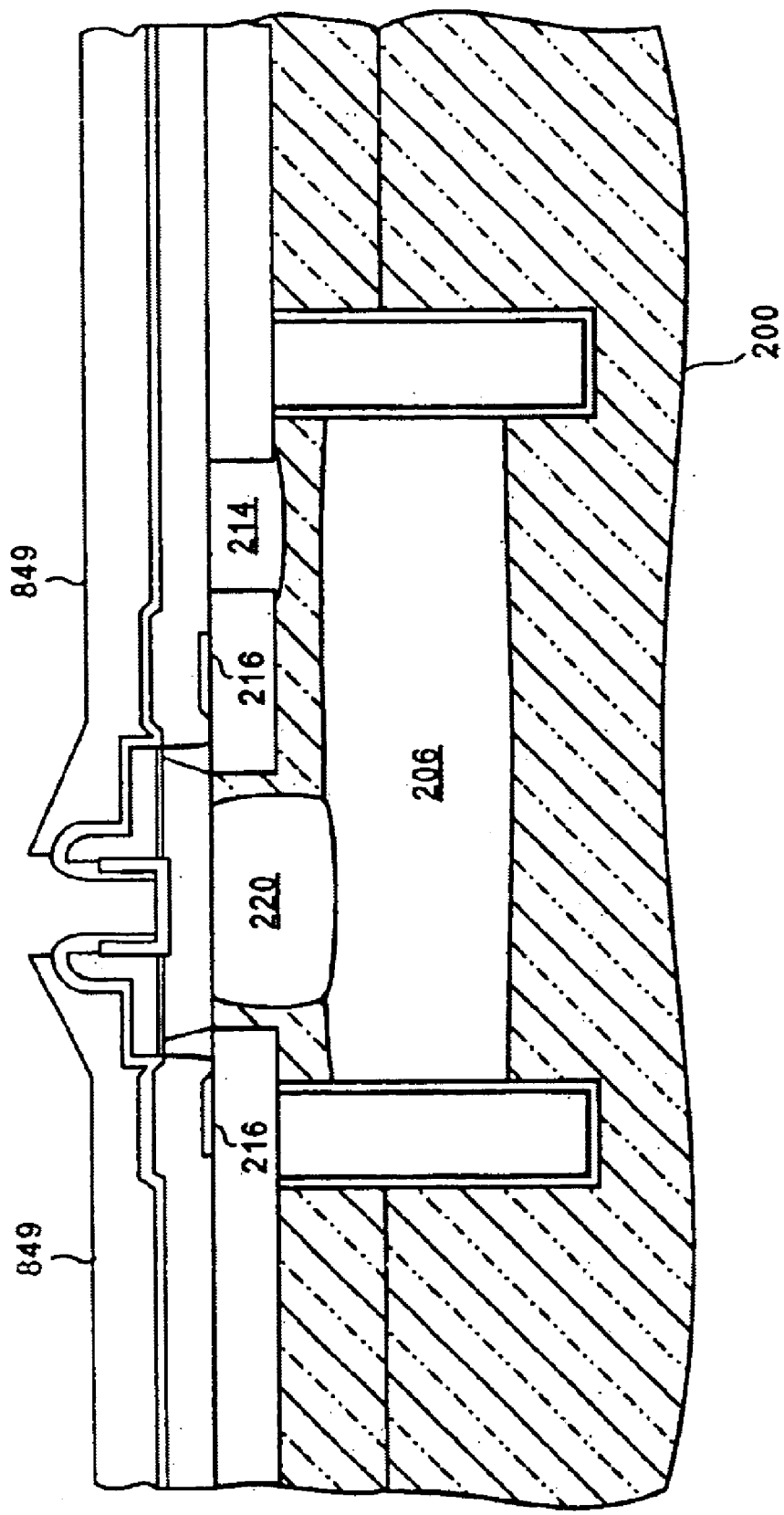

Turning now to FIG. 31, the wafer portion 200 is illustrated after the deposition of spacer material 847. Again, the material can comprise 500 Angstroms of silicon nitride. Turning now to FIG. 32, the wafer portion is illustrated after the deposition and patterning of photoresist 849 to expose the emitter area, and after the spacer material 847 etched away using a suitable directional etch, forming sidewall spacers over the sides of hipox 845 while exposing the lower portion of hipox 845.

The next step 830 is to form the emitter opening. Where the dopant source layer was converted to the silicon dioxide, the emitter opening is formed by etching through the silicon dioxide to the SiGe layer. This etch can be performed selective to the sidewall spacers formed on the vertical portions of the cap layer and the converted dopant source layer.

Figure 33:
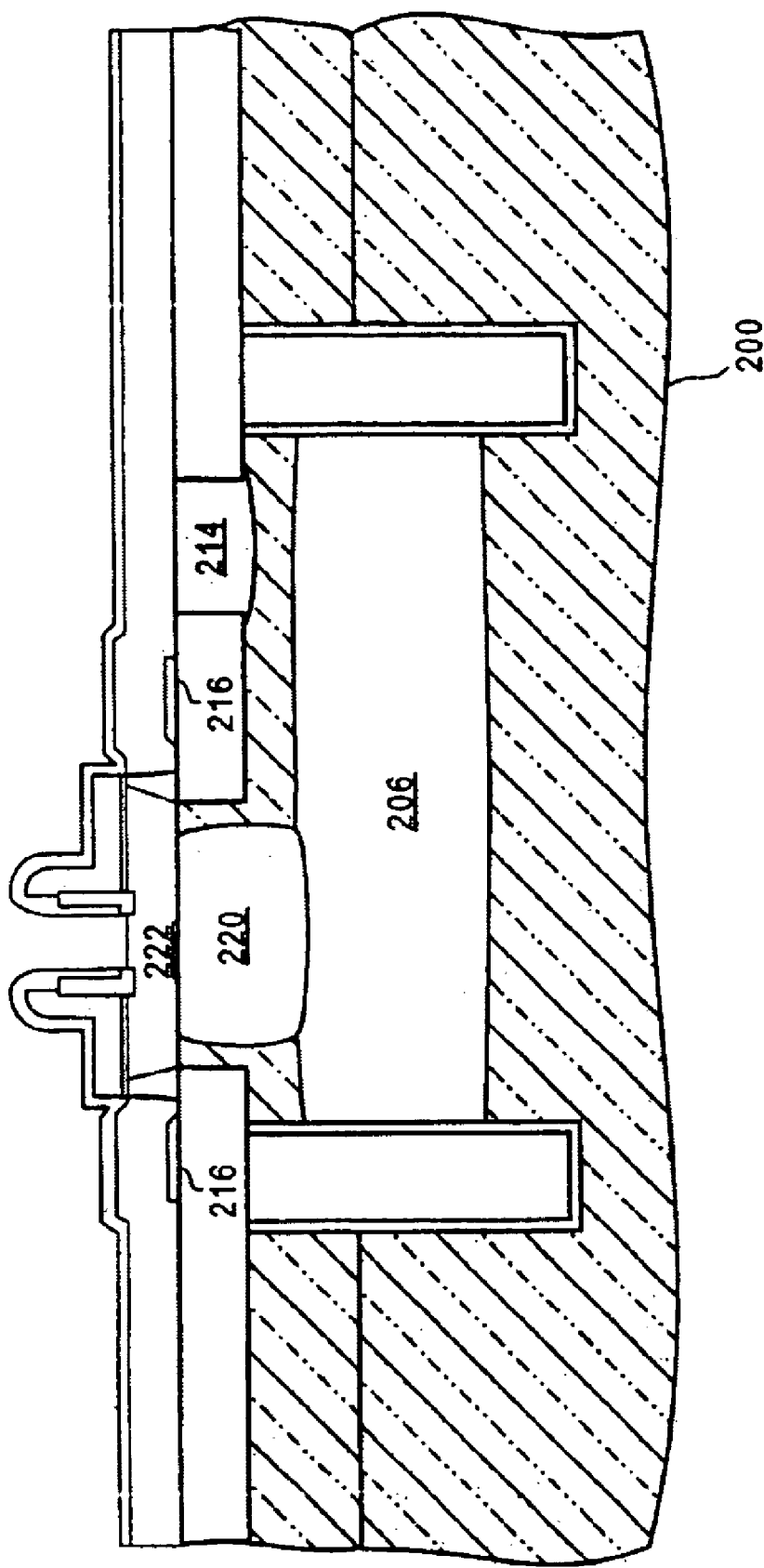

Turning now to FIG. 33, the wafer portion 200 is illustrated after the bottom portion of converted dopant source layer, the hipox 245 has been etched away selective to sidewall spacers. This etch exposes the emitter portion of the single crystal SiGe film 222.

Figure 34:
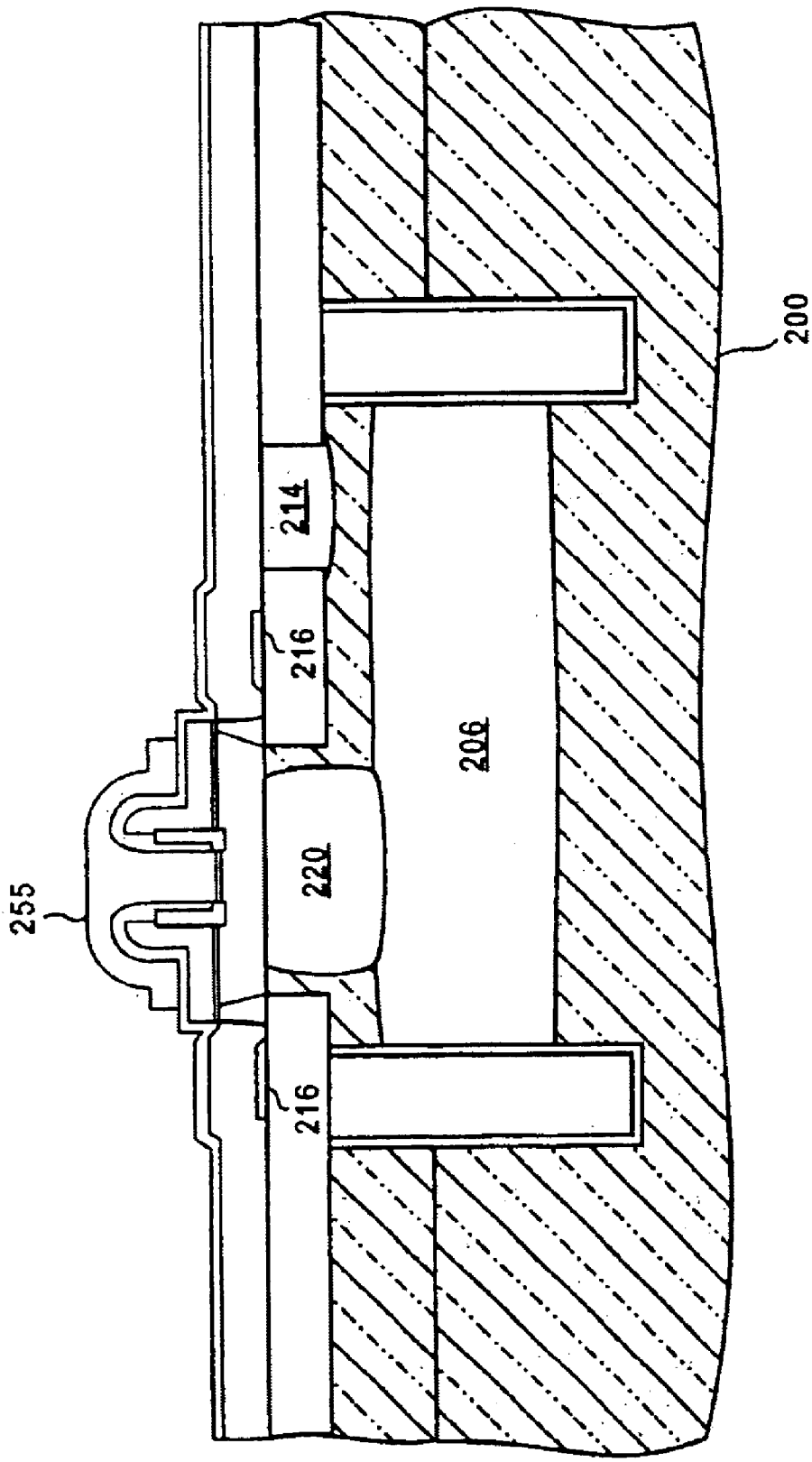
Figure 35:
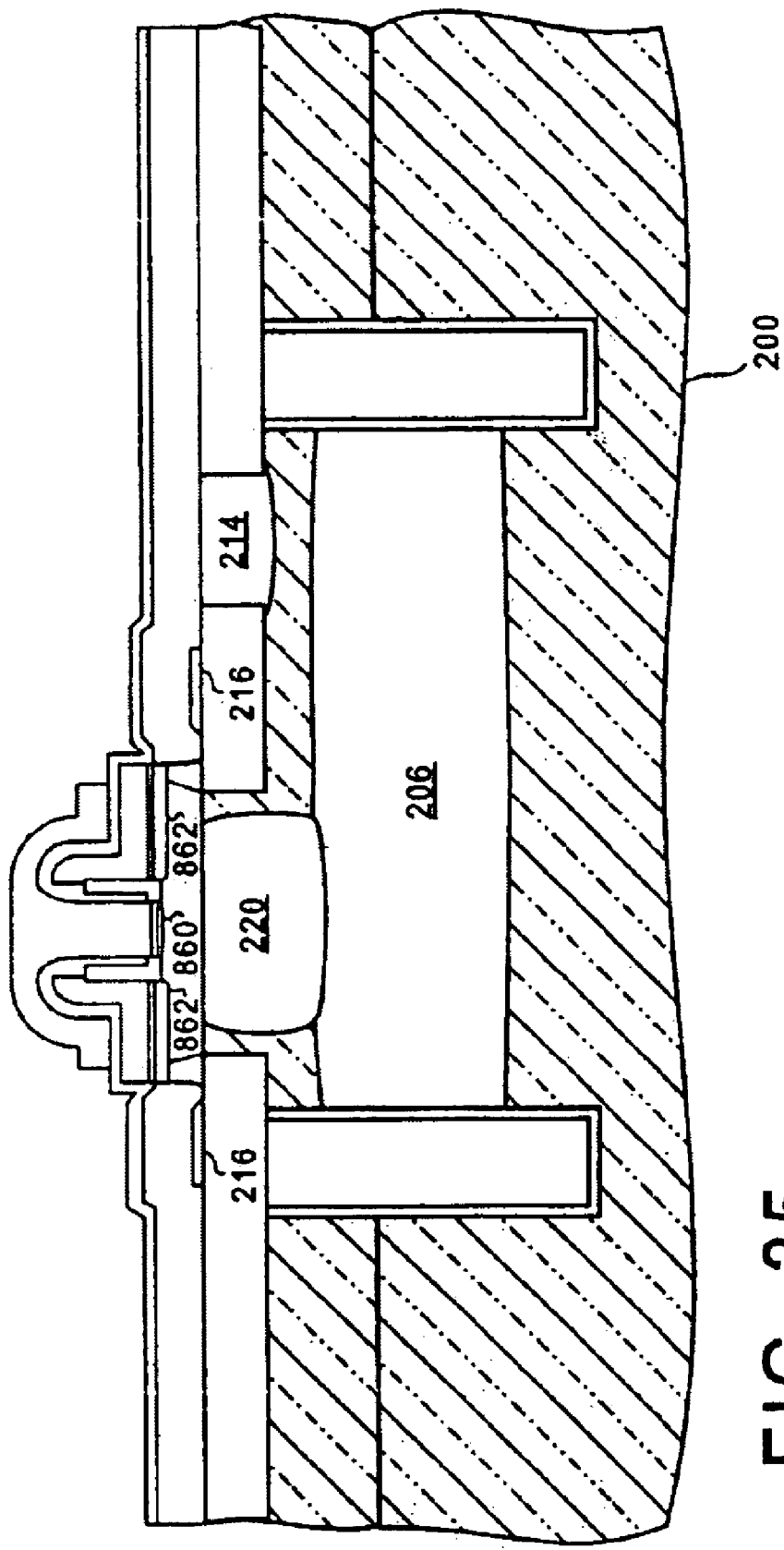

Steps 832 to 836 then parallel steps 132 to 136 of method 100. This includes the formation of the emitter base oxide and deposit and pattern the emitter material, diffusing in the junctions and the portion of the intrinsic base, and the completion of the transistors. FIG. 34 illustrate an example of the formation and patterning of emitter material 255. FIG. 35 illustrates after the diffusion of dopants from the emitter material 255 and dopant source layer 836 to form the emitter 860 and the outer portion of the extrinsic base 862.

The present invention thus provides a unique device structure and method that provides increased transistor performance in integrated bipolar circuit devices. The preferred embodiment of the present invention provides improved high speed performance by providing reduced base resistence. The preferred design forms the extrinsic base by diffusing dopants from a dopant source layer and into the extrinsic base region. This diffusion of dopants forms at least a portion of the extrinsic base. In particular, the portion adjacent to the intrinsic base region is formed by diffusion. This solution avoids the problems caused by traditional solutions that implanted the extrinsic base. Specifically, by forming at least a portion of the extrinsic base by diffusion, the problem of damage to base region is minimized. This reduced damage enhances dopant diffusion into the intrinsic base. Additionally, the formed extrinsic base can have improved resistence, resulting in an improved maximum frequency for the bipolar device.

While the invention has been particularly shown and described with reference to heterojunction bipolar transistors, those skilled in the art will recognized that the preferred methods can be used to form other types of transistors, and that various changes in form and details may be made therein without departing from the spirit and scope of the invention. For example, it can be used with other BiCMOS passive and active elements, such as other types of transistors, varactors, and/or a p-i-n diode.

What is claimed is:

1. A transistor comprising:
    an epitaxial layer on a semiconductor substrate;
    a dopant source dopant source layer on the epitaxial layer; and
    dopant from the dopant source layer distributed within the epitaxial layer to form at least a portion of an extrinsic base for the transistor within the epitaxial layer, a first surface of said portion of the extrinsic base being in direct mechanical contact with the dopant source layer, said portion of the extrinsic base being disposed between the dopant source layer and an intrinsic base for the transistor, said intrinsic base being totally within the epitaxial layer, a second surface of said portion of the extrinsic base being in direct mechanical contact with the intrinsic base, said second surface being opposite said first surface and not contacting said first surface.

2. The transistor of claim 1, wherein the dopant source layer comprises a doped single crystal layer formed on the epitaxial layer.

3. The transistor of claim 1, wherein the epitaxial layer comprises a silicon germanium layer.

4. The transistor of claim 1, the dopant source layer is doped between $5 \times 10_{19}$ and $1 \times 10_{21}$ atoms/cm$_3$.

5. The transistor of claim 1, wherein the dopant source layer comprises a raised portion of the extrinsic base that is coupled to the dopants diffused from the dopant source layer.

6. The transistor of claim 1, further comprising a pedestal on the epitaxial layer, wherein the dopant source layer is formed around the pedestal such that the pedestal defines a portion of the epitaxial layer in which the dopant source layer is not formed on the epitaxial layer.

7. The transistor of claim 6, wherein the pedestal further defines an emitter opening.

8. The transistor of claim 1, further comprising the steps of:
a subcollector within the semiconductor substrate; and
a pedestal implant within the semiconductor substrate, wherein the pedestal implant has a first surface and an opposing second surface, wherein the first surface of the pedestal implant is in direct mechanical contact with the subcollector, wherein the second surface of the pedestal implant is in direct mechanical contact with the intrinsic base, and wherein the pedestal implant is not in direct mechanical contact with said portion of the extrinsic base.

9. The transistor of claim 8, further comprising a deep trench isolation at the edges of the subcollector, said deep trench isolation surrounding the subcollector and electrically isolating the subcollector.

10. A transistor, comprising:
an epitaxial layer on a semiconductor substrate;
a dopant source layer on a first portion of the epitaxial layer;
an emitter material on a second portion of the epitaxial layer, said second portion of the epitaxial layer being adjacent to said first portion of the epitaxial layer;
dopant from the dopant source layer within the epitaxial layer to form at least a portion of an extrinsic base for the transistor within the epitaxial layer, said portion of the extrinsic base being in direct mechanical contact with the dopant source layer, a first surface of said portion of the extrinsic base being disposed between the dopant source layer and an intrinsic base for the transistor, said intrinsic base being totally within the epitaxial layer, a second surface of said portion of the extrinsic base being in direct mechanical contact with the intrinsic base, said second surface being opposite said first surface and not contacting said first surface; and
emitter dopant from the emitter material within said second portion of the epitaxial layer, said emitter dopant forming an emitter for the transistor, said emitter being totally within the epitaxial layer, said emitter being surrounded by said portion of the extrinsic base.

11. The transistor of claim 10, further comprising:
a cap layer on the dopant source layer; and
a spacer layer on the cap layer,
wherein a first surface of the spacer layer is in direct mechanical contact with a surface of the emitter material,
wherein a second surface of the spacer layer is in direct mechanical contact with a first surface of the cap layer,
wherein a second surface of the cap layer is in direct mechanical contact with a surface of the dopant source layer, and
wherein the surface of the emitter material, the first surface of the spacer layer, the second surface of the spacer layer, the first surface of the cap layer, the second surface of the cap layer, and the surface of the dopant source layer are about parallel.

12. The transistor of claim 10, further comprising:
a subcollector within the semiconductor substrate; and
a pedestal implant within the semiconductor substrate, wherein the pedestal implant has a first surface and an opposing second surface, wherein the first surface of the pedestal implant is in direct mechanical contact with the subcollector, wherein the second surface of the pedestal implant is in direct mechanical contact with the intrinsic base, and wherein the pedestal implant is not in direct mechanical contact with said portion of the extrinsic base.

13. The transistor of claim 12, further comprising a trench isolation at the edges of the subcollector, said deep trench isolation surrounding the subcollector and electrically isolating the subcollector.

14. A transistor, comprising:
semiconductor substrate;
epitaxial layer on the substrate;
a dopant source layer on the epitaxial layer;
dopant from the dopant source layer distributed within the epitaxial layer to form a first portion of an extrinsic base for the transistor within the epitaxial layer, said first portion of the extrinsic base being in direct mechanical contact with the dopant source layer, said first portion of the extrinsic base being disposed between the dopant source layer and an intrinsic base for the transistor, said intrinsic base being totally within the epitaxial layer; and
a pedestal on the epitaxial layer, wherein the dopant source layer is formed around the pedestal such that the pedestal defines a portion of the epitaxial layer in which the dopant source layer is not formed on the epitaxial layer, wherein the pedestal comprises a high pressure oxide layer, a nitride layer above the high pressure oxide layer, and an oxide layer above the nitride layer, and patterning the high pressure oxide layer, nitride layer and oxide layer, and wherein the dopant source layer does not exist above the high pressure oxide layer.

15. The transistor of claim 14, wherein the dopant source layer comprises a raised portion of the extrinsic base.

16. The transistor of claim 14, wherein the pedestal defines an emitter region of the epitaxial layer.

17. The transistor of claim 14, further comprising a second portion of the extrinsic base distributed within epitaxial layer.

* * * * *